United States Patent
Pan

(10) Patent No.: US 10,003,024 B2
(45) Date of Patent: Jun. 19, 2018

(54) MATERIALS FOR ORGANIC ELECTROLUMINESCENT DEVICES

(71) Applicant: Merck Patent GmbH, Darmstadt (DE)

(72) Inventor: Junyou Pan, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 356 days.

(21) Appl. No.: 14/431,578

(22) PCT Filed: Sep. 5, 2013

(86) PCT No.: PCT/EP2013/002672
§ 371 (c)(1),
(2) Date: Mar. 26, 2015

(87) PCT Pub. No.: WO2014/048542
PCT Pub. Date: Apr. 3, 2014

(65) Prior Publication Data
US 2015/0255724 A1    Sep. 10, 2015

(30) Foreign Application Priority Data
Sep. 27, 2012   (EP) ...................................... 12006747

(51) Int. Cl.
*H01L 51/00*   (2006.01)
*H01L 51/50*   (2006.01)
(Continued)

(52) U.S. Cl.
CPC .......... *H01L 51/0035* (2013.01); *C08G 61/12* (2013.01); *C09K 11/025* (2013.01);
(Continued)

(58) Field of Classification Search
None
See application file for complete search history.

(56) References Cited

U.S. PATENT DOCUMENTS

2007/0029556 A1   2/2007  Su et al.
2008/0248313 A1*  10/2008 Seshadri .............. C08G 61/126
                                                      428/419
(Continued)

FOREIGN PATENT DOCUMENTS

DE    WO 2011110275 A2 *  9/2011  ........... A61N 5/0616

OTHER PUBLICATIONS

Redecker et al. "High Mobility Hole Transport Fluorene-Triarylamine Copolymers" Adv. Mater. 1999, 11(3), 241-246.*
(Continued)

*Primary Examiner* — Robert S Loewe
(74) *Attorney, Agent, or Firm* — Kim Winston LLP

(57) ABSTRACT

The present invention relates to an organic composition which comprises a conjugated polymer as hole-transport compound and a doping compound. The present invention furthermore relates to the use of the composition according to the invention in organic electroluminescent devices, in particular in the so-called buffer layer of such devices. The present invention also relates to a formulation which comprises the composition according to the invention and a solvent and to an organic electroluminescent device which comprises the composition according to the invention.

14 Claims, 1 Drawing Sheet

(51) Int. Cl.
*C08G 61/12* (2006.01)
*C09K 11/02* (2006.01)
*C09K 11/06* (2006.01)
*H01L 51/52* (2006.01)

(52) U.S. Cl.
CPC ............ *C09K 11/06* (2013.01); *H01L 51/002* (2013.01); *H01L 51/0036* (2013.01); *H01L 51/0039* (2013.01); *H01L 51/0043* (2013.01); *H01L 51/0085* (2013.01); *H01L 51/506* (2013.01); *C08G 2261/135* (2013.01); *C08G 2261/1412* (2013.01); *C08G 2261/1414* (2013.01); *C08G 2261/1424* (2013.01); *C08G 2261/314* (2013.01); *C08G 2261/3142* (2013.01); *C08G 2261/3162* (2013.01); *C08G 2261/3223* (2013.01); *C08G 2261/3243* (2013.01); *C08G 2261/342* (2013.01); *C08G 2261/411* (2013.01); *C08G 2261/512* (2013.01); *C08G 2261/76* (2013.01); *C08G 2261/792* (2013.01); *C08G 2261/95* (2013.01); *C09K 2211/185* (2013.01); *H01L 51/5008* (2013.01); *H01L 51/5016* (2013.01); *H01L 51/5088* (2013.01); *H01L 51/5206* (2013.01); *H01L 51/5221* (2013.01); *Y02E 10/549* (2013.01)

(56) References Cited

U.S. PATENT DOCUMENTS

| | | | | |
|---|---|---|---|---|
| 2009/0108746 A1* | 4/2009 | Park | .................... | C07D 401/04 313/504 |
| 2009/0152531 A1* | 6/2009 | Towns | .................. | C08G 61/02 257/40 |
| 2009/0256117 A1* | 10/2009 | Seshadri | .............. | C08G 61/126 252/500 |
| 2010/0025703 A1* | 2/2010 | Towns | .................... | C08L 65/00 257/98 |
| 2010/0140601 A1 | 6/2010 | Noguchi | | |
| 2011/0037058 A1 | 2/2011 | Buchholz et al. | | |
| 2011/0278559 A1* | 11/2011 | Brown | ................. | C08G 61/126 257/40 |
| 2013/0006118 A1* | 1/2013 | Pan | ..................... | A61N 5/0616 600/476 |
| 2013/0092887 A1* | 4/2013 | Seshadri | ................. | H01B 1/12 252/519.21 |

OTHER PUBLICATIONS

Snaith et al. "Enhanced charge mobility in a molecular hole transporter via addition of redox inactive ionic dopant: Implication to dye-sensitiezed solar cells" Appl. Phys. Lett. 89, 262114, 2006.*

Yamamori et al. "Electroluminescence of organic light emitting diodes with a thick hole transport layer composed of a triphenylamine based polymer doped with an antimonium compound" J. Appl. Phys. 86(8), 1999, 4369-4376.*

Ito et al. "Organic light-emitting devices having chemically-doped arylamine oligomer as a hole injection layer" Polym. Adv. Technol. 2005, 16, 559-562.*

International Search Report for International Application No. PCT/EP2013/002672; International Filing Date Sep. 5, 2013.

* cited by examiner

MATERIALS FOR ORGANIC ELECTROLUMINESCENT DEVICES

RELATED APPLICATIONS

This application is a national stage application, filed pursuant to 35 U.S.C. § 371, of PCT/EP2013/002672, filed Sep. 5, 2013, which claims the benefit of European Patent Application No. 12006747.5, filed Sep. 27, 2012, which is incorporated herein by reference in its entirety.

The present invention relates to an organic composition which comprises a conjugated polymer as hole-transport compound and a doping compound. The present invention furthermore relates to the use of the composition according to the invention in organic electroluminescent devices, in particular in the so-called buffer layer of such devices. The present invention also relates to a formulation which comprises the composition according to the invention and a solvent and to an organic electroluminescent device which comprises the composition according to the invention.

In the past, predominantly small molecules were employed as useful components, for example as phosphorescence emitters, in organic electroluminescent devices. The use of small molecules in organic electroluminescent devices (SMOLED) facilitates good colour efficiencies, long lifetimes and the requisite low operating voltages. The disadvantage of such systems is, however, the complex production. Thus, for example, layer deposition of the small molecules requires complex processes, such as, for example, thermal coating processes, which results in a limited maximum device size.

Conjugated polymers having the corresponding properties have therefore been used for some time for opto-electronic applications, since these can be applied easily and inexpensively as layer by rotation coating or print coating. In addition, systems of this type usually have a long lifetime. Conjugated polymers have already been investigated intensively for some time as highly promising materials in OLEDs (organic light emitting device). OLEDs which contain polymers as organic materials are frequently also known here as PLEDs (polymer light emitting device). Their simple preparation promises inexpensive production of corresponding electroluminescent devices.

PLEDs consist either only of one layer which is able to combine as far as possible all functions (charge injection, charge transport, recombination) of an OLED in itself or they consist of a plurality of layers which have the respective functions individually or in some cases combined. Different monomers which take on the corresponding functions are employed for the polymerisation for the preparation of polymers having the corresponding properties.

FIG. 1 shows an OLED which consists of a plurality of layers. An OLED of this type preferably comprises a cathode, an emitting layer (EML), an interlayer, a buffer layer and indium tin oxide (ITO) as anode.

Buffer layers generally have a major influence on the performance of the PLEDs/OLEDs. They usually have two different functions: 1) smoothing of the surface of the ITO in order to prevent the formation of so-called "dark spots"; 2) supporting hole injection into the organic layer.

However, materials currently commercially available for buffer layers do not have high stability to reduction or to electrons, meaning that their use does not result in very good lifetimes of the OLEDs/PLEDs.

Attempts were therefore firstly made in the prior art to solve this problem through the use of an interlayer between buffer layer and EML, in which the interlayer was employed as hole-transport layer and as electron-blocking layer in order to improve the efficiency of the PLEDs/OLEDs. However, no interlayer known to date is to date capable of completely blocking electrons. It would therefore be very desirable to have a buffer layer which is resistant to reduction and electrons.

It was therefore an object of the present invention to provide a composition which can be used as buffer layer having excellent resistance to electrons and reduction in a PLED/OLED. A further object of the present invention was to reduce the number of requisite layers in a PLED/OLED using a novel buffer layer.

The present objects have been achieved by the provision of an organic composition which comprises the following components:
a) a hole-transport compound, and
b) a doping compound selected from ionic compounds
where the hole-transport compound is a conjugated polymer which includes or consists of a polymer segment of the general formula (1):

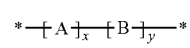

formula (1)

where the symbols and indices used have the following meanings:

B is a recurring unit which is selected on each occurrence, identically or differently, from the group consisting of amine, triarylamine, thiophene, carbazole, phenanthrene, dehydrophenanthrene, fluorene, spirobifluorene, benzofluorene, dibenzofluorene, indenofluorene, indolocarbazoles and derivatives thereof, where triarylamine, phenanthrene or a derivative thereof is preferred;

A is a recurring unit which is selected on each occurrence, identically or differently, from the group consisting of phenylenevinylene, phenanthrene, dehydrophenanthrene, fluorene, spirobifluorene, benzofluorene, dibenzofluorene, indenofluorene, indolocarbazole and derivatives thereof, where fluorene, indenofluorene, spirobifluorene, phenanthrene or a derivative thereof is preferred;

x and y
are intended to denote that the units A and B are in the form of recurring units in the conjugated polymer; the ratio of the units A and B to one another can be expressed here by the ratio x:y and is preferably in the range from 9:1 to 1:9, more preferably 6:1 to 1:6 and most preferably in the range from 3:2 to 2:3;

n is 0, 1, 2, 3 or 4, where 0 or 1, is preferred and 0 is particularly preferred;

r is greater than or equal to 1, in which 1, 2 or 3 is preferred and 1 or 2 is particularly preferred.

It is preferred in accordance with the invention that the recurring units A and B are different from one another. Examples of recurring units which fall under the above-mentioned compounds are disclosed, for example, in WO 2004/041901 A1, EP 01491568 A1, WO 2005/104264 A1, DE 10337346 A1, WO 2003/099901 A1, U.S. Pat. No. 5,962,631, WO 2006/052457 A2, WO 2006/118345 A1, WO 2005/056633 A1, EP 1344788 A1 and WO 2007/043495 A1.

An alkylamino group and an arylamino group are taken to mean primary amino groups which are bonded to an alkyl radical or an aryl radical. A dialkylamino group, a diarylamino group or an alkylarylamino group is taken to mean secondary amino groups to which either two alkyl radicals, two aryl radicals or one alkyl and one aryl radical are bonded.

For the purposes of the present invention, an alkyl radical is preferably taken to mean straight-chain, branched or cyclic alkyl groups. The straight-chain alkyl groups preferably have 1 to 40, more preferably 1 to 20 and most preferably 1 to 6 carbon atoms. The branched or cyclic alkyl groups preferably have 3 to 40, more preferably 3 to 20 and most preferably 3 to 6 carbon atoms. In all three cases, preference is given to alkyl groups having 1 or 3 to 6 carbon atoms, particularly preferably 1 to 3 carbon atoms. One or more hydrogen atoms on these alkyl groups may preferably also be replaced by a fluorine atom. In addition, one or more of the $CH_2$ groups of these units may be replaced by NR, O or S (R here is a radical which is selected from the group consisting of H and $C_{1-6}$-alkyl). If one or more of the $CH_2$ groups is replaced by NR, O or S, it is particularly preferred for only one of these groups to be replaced; particularly preferably by an O atom. Examples of such compounds include the following: methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl and 2,2,2-trifluoroethyl.

An aryl radical in the context of this invention is taken to mean a mono- or polycyclic aromatic or heteroaromatic hydrocarbon radical. These preferably contain 5 to 20, more preferably 5 to 10 and most preferably 5 or 6 aromatic ring atoms. If the radical is an aromatic unit, it preferably contains 6 to 20, more preferably 6 to 10, most preferably 6 carbon atoms as ring atoms. If the radical is a heteroaromatic unit, it contains 5 to 20, more preferably 5 to 10, most preferably 5 aromatic ring atoms, at least one of which is a heteroatom. The heteroatoms are preferably selected from N, O and/or S. An aromatic or heteroaromatic unit here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole etc.

Examples according to the invention of the aromatic or heteroaromatic unit are accordingly: benzene, naphthalene, anthracene, phenanthrene, pyrene, chrysene, benzanthracene, perylene, naphthacene, pentacene, benzopyrene, furan, benzofuran, isobenzofuran, dibenzofuran, thiophene, benzothiophene, isobenzothiophene, dibenzothiophene, pyrrole, indole, isoindole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In the present application, the term "polymer" is taken to mean both polymeric compounds, oligomeric compounds and dendrimers. The polymeric compounds according to the invention preferably have 10 to 10000, particularly preferably 20 to 5000 and in particular 50 to 2000 structural units. The oligomeric compounds according to the invention preferably have 2 to 9 structural units. The branching factor of the polymers here is between 0 (linear polymer, no branching sites) and 1 (fully branched dendrimer).

The conjugated polymer in the composition according to the invention can be a crosslinked or uncrosslinked polymer. In the case where the polymer according to the invention is an uncrosslinked polymer, it may, however, contain a crosslinkable group—preferably in a side chain. The crosslinkable group (group for crosslinking) is preferably, in particular, vinyl or allyl groups. The group for the crosslinking of the conjugated polymer is preferably covalently bonded to the conjugated polymer and/or the ionic compound.

The hole-transport compound and/or the doping compound is/are preferably soluble in an organic solvent. The organic solvents used can be dichloromethane, trichloromethane, monochlorobenzene, o-dichlorobenzene, tetrahydrofuran, anisole, mesitylene, morpholine, toluene, o-xylene, m-xylene, p-xylene, 1,4-dioxane, acetone, methyl ethyl ketone, 1,2-dichloroethane, 1,1,1-trichloroethane, 1,1,2,2-tetrachloroethane, ethyl acetate, n-butyl acetate, dimethylacetamide, tetralin, decalin, indane, cyclohexanone, dimethylformamide (DMF), dimethyl sulfoxide (DMSO), propylene carbonate, dichloromethane (DCM), tetrahydrofuran (THF), ethyl acetate, acetone, acetonitrile, formic acid, n-butanol, isopropanol, n-propanol, acetic acid, ethanol, methanol or also mixtures thereof, in which cyclohexanone, dimethylformamide (DMF), dimethyl sulfoxide (DMSO), propylene carbonate, formic acid and n-butanol are preferred in accordance with the invention.

The composition according to the invention preferably comprises an ion-conducting compound. As ion-conducting compounds, the person skilled in the art will be able to use various compounds or formulations, depending on which ion comes into question. Examples of lithium ions and protons are described as follows.

Suitable lithium ion conductors are formulation or mixtures comprising one or more of the following polymers: perfluorosulfonic acid, polybenzimidazoles, sulfonated polyether ketone, sulfonated naphthalenic polyimides, polyethylene oxide and derivatives thereof. Particularly preferred Li ion conductors are polyethylene oxide and derivatives thereof.

Suitable proton-conducting polymers can be selected from the polymers for proton-exchange membrane for fuel cells. Such polymers are well known to the person skilled in the art. Examples thereof are disclosed by Flicker et al. in Chemical Reviews 2004, 104, 4587-4612.

The conjugated polymer in the composition according to the invention can be a conjugated block copolymer or a conjugated random copolymer, where the units A and B in the latter are in a random distribution. However, the polymer can also be a polymer which contains segments which are randomly distributed and segments of the general formula (2), or contains only segments of the general formula (2):

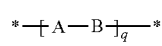

formula (2)

where the index q is intended to denote that the unit -A-B— is a recurring unit in the polymer. A and B in the formula (2) have the same meanings as defined above.

The recurring units B and A, in particular A, can be, independently of one another, a structural unit of the general formula (3):

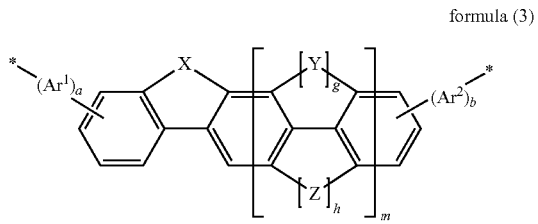

formula (3)

where the symbols and indices used have the following meanings:

X, Y and Z are on each occurrence, independently of one another, a divalent group selected from the group consisting of —CR$^2$R$^3$—, —NR$^2$—, —PR$^2$—, —O—, —S—, —SO$_2$—, —CO—, —CS—, —CSe—, —P(=O)R$^2$—, —P(=S)R$^2$— and SiR$^2$R$^3$;

R$^2$ and R$^3$ are on each occurrence, independently of one another, H, halogen, —CN, —NC, —NCO, —NCS, —OCN, —SCN, —C(=O)NR$^4$R$^5$, —C(=O)X, —C(=O)R$^4$, —NH$_2$, —NR$^4$R$^5$, —SH, —SR$^4$, —SO$_3$H, —SO$_2$R$^4$, OH, —NO$_2$, —CF$_3$, —SF, optionally substituted silyl or a hydrocarbon radical having 1 to 40 C atoms, which may be substituted and may contain one or more heteroatoms, where the radicals R$^2$ and R$^3$ together may form a carbyl radical, or, together with the fluorene radical to which they are bonded, may also form a spiro group;

R$^4$ and R$^5$ are on each occurrence, independently of one another, H or an optionally substituted hydrocarbon radical having 1 to 40 C atoms, which may contain one or more heteroatoms, where the radicals R$^4$ and R$^5$ together may form a carbyl radical;

g, h are on each occurrence, in each case independently of one another, 0 or 1, where each h corresponding to g in the same unit is, differently to g, in each case 0 or 1;

X is halogen;

m is 0, 1, 2 or 3, preferably 0 or 1;

Ar$^1$ and Ar$^2$ are on each occurrence, identically or differently, a divalent aromatic or heteroaromatic unit having 6 or 5 to 40 ring atoms respectively, which may be substituted by one or more radicals R$^2$, where the ring system may also be condensed onto positions 7,8 or 8,9 of the structural unit of the general formula (3); and a and b are in each case, independently of one another, 0 or 1.

A "silyl" in the present invention is taken to mean a compound of the general empirical formula Si$_n$H$_{2n+2}$, in which n is preferably equal to 1 to 5, and where one or more H atoms may be substituted by an alkyl or aryl radical—as defined above.

A hydrocarbon radical having 1 to 40 C atoms is taken to mean radicals as defined above in connection with the terms "alkyl radical" or "aryl radical".

A carbyl radical in the sense of this application is taken to mean a radical =C—R'"$_2$, where R'" in each case, independently of one another, represents a hydrocarbon radical as defined above.

A divalent aromatic or heteroaromatic unit having 6 or 5 to 40, more preferably 6 or 5 to 20, most preferably 6 or 5 to 10 aromatic ring atoms respectively can be a mono- or polycyclic unit. If the unit is an aromatic unit, it preferably contains 6 to 40, more preferably 6 to 20, most preferably 6 to 10 carbon atoms as ring atoms. If the unit is a heteroaromatic unit, it contains 5 to 40, more preferably 5 to 20, most preferably 5 to 10 aromatic ring atoms, at least one of which is a heteroatom. The heteroatoms are preferably selected from N, O and/or S. An aromatic or heteroaromatic unit here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole etc.

Examples according to the invention of the aromatic or heteroaromatic unit are accordingly: benzene, naphthalene, anthracene, phenanthrene, pyrene, chrysene, benzanthracene, perylene, naphthacene, pentacene, benzopyrene, furan, benzofuran, isobenzofuran, dibenzofuran, thiophene, benzothiophene, isobenzothiophene, dibenzothiophene, pyrrole, indole, isoindole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,1-tetraazaperylene, pyrazine, phenazine, phenoxazine, phenothiazine, fluorubin, naphthyridine, benzocarbolise, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

As divalent unit, the above-mentioned compounds are present in such a form that two hydrogen substituents are not present and these compounds are bonded at these sites—as indicated in formula (3).

The recurring units B and A can likewise be, independently of one another, a structural unit of the general formulae (4-1) and (4-2):

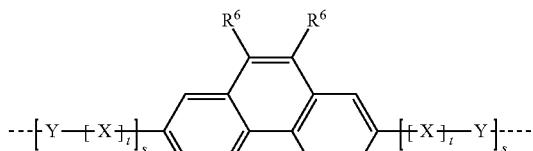

formula (4-1)

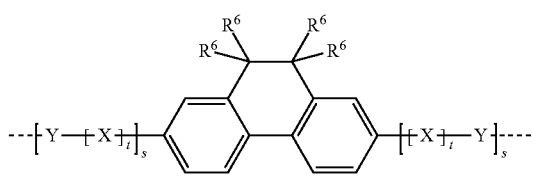

formula (4-2)

where the symbols and indices used have the following meaning:

$R^6$ is on each occurrence, identically or differently, H, a straight-chain, branched or cyclic alkyl radical having 1 or 3 to 40 C atoms respectively, which may be substituted by $R^7$, in which, in addition, one or more non-adjacent C atoms may be replaced by N—$R^7$, O, S, O—CO—O, CO—O, —$CR^7$=$CR^7$— or —C≡C—, with the proviso that the heteroatoms are not bonded directly to the phenanthrene unit, and in which, in addition, one or more H atoms may be replaced by F, Cl or CN, or an aromatic or heteroaromatic ring system having 6 or 5 to 40 ring atoms respectively, which may also be substituted by one or more radicals $R^7$; two of the radicals $R^6$ here may also each form a further mono- or polycyclic, aromatic or aliphatic ring system with one another; with the proviso that at least one of the radicals $R^6$ is in each case not equal to H;

X is on each occurrence, identically or differently, —$CR^7$=$CR^7$—, —C≡C— or N—$Ar^3$;

Y is on each occurrence, identically or differently, a divalent aromatic or heteroaromatic unit having 6 or 5 to 40 ring atoms respectively, which may be substituted by one or more radicals $R^7$;

$R^7$ is on each occurrence, identically or differently, H, a straight-chain, branched or cyclic alkyl or alkoxy radical having 1 or 3 to 22 C atoms respectively, in which, in addition, one or more nonadjacent C atoms may be replaced by N—$R^8$, O, S, O—CO—O, CO—O, —$CR^9$=$CR^9$—, —C≡C— and in which, in addition, one or more H atoms may be replaced by F, Cl, Br, I or CN, or an aryl, heteroaryl, aryloxy or heteroaryloxy group having 5 to 40 C atoms, which may also be substituted by one or more non-aromatic radicals $R^7$; two or more of the radicals $R^7$ here may also form a ring system with one another and/or with an $R^6$; or F, Cl, CN, $N(R^{10})_2$, $Si(R^{10})_3$ or $B(R^{10})_2$;

$R^8$ is on each occurrence, identically or differently, H or a hydrocarbon radical having 1 to 20 C atoms;

$R^9$ is on each occurrence, identically or differently, H, a straight-chain, branched or cyclic alkyl or alkoxy radical having 1 or 3 to 22 C atoms respectively, in which, in addition, one or more nonadjacent C atoms may be replaced by N—$R^8$, O, S, O—CO—O, CO—O, —C≡C— and in which, in addition, one or more H atoms may be replaced by F, Cl, Br, I or CN, or an aryl or aryloxy radical having 5 to 40 C atoms, which may in each case also be substituted by one or more non-aromatic radicals $R^9$; two or more of the radicals $R^9$ here may also form a ring system with one another and/or with an $R^6$ or $R^7$; or F, Cl, CN, $N(R^{10})_2$, $Si(R^{10})_3$ or $B(R^1)_2$;

$R^{10}$ is on each occurrence, identically or differently, H or an aliphatic or aromatic hydrocarbon radical having 1 to 20 C atoms;

$Ar^a$ is on each occurrence, identically or differently, an aromatic or heteroaromatic ring system having 6 or 5 to 40 ring atoms respectively, which may be substituted by $R^7$;

t is on each occurrence, identically or differently, 0 or 1;

s is on each occurrence, identically or differently, 0, 1 or 2, where s is preferably equal to 0;

where the dashed bond denotes the linking in the polymer.

An aromatic ring system having 6 to 40 ring atoms, more preferably 6 to 20 and most preferably 6 to 10 ring atoms in the sense of this invention is preferably taken to mean a mono- or polycyclic system. An aromatic ring system in the sense of the present invention is intended to be taken to mean a system which does not necessarily contain only aromatic groups, but instead in which a plurality of aromatic may also be interrupted by a short non-aromatic unit (<10% of the atoms other than H, preferably <5% of the atoms other than H), such as, for example, $sp^3$-hybridised C, O, N, etc. These aromatic ring systems can be monocyclic or polycyclic, i.e. they may contain one ring (for example phenyl) or two or more rings, which may also be condensed (for example naphthyl) or covalently linked (for example biphenyl), or contain a combination of condensed and linked rings.

Preferred aromatic ring systems are, for example, phenyl, biphenyl, triphenyl, naphthyl, anthracyl, binaphthyl, phenanthryl, dihydrophenanthryl, pyrene, dihydropyrene, chrysene, perylene, tetracene, pentacene, benzopyrene, fluorene and indene.

A heteroaromatic ring system having 5 to 40 ring atoms, preferably 5 to 30 and particularly preferably 5 to 14 ring atoms in the sense of this invention is taken to mean a mono- or polycyclic system. The heteroaromatic ring system contains at least one heteroatom selected from N, O and S (remaining atoms are carbon). In addition, a heteroaromatic ring system is intended to be taken to mean a system which does not necessarily contain only aromatic or heteroaromatic groups, but instead in which a plurality of aromatic or heteroaromatic groups may also be interrupted by a short nonaromatic unit (<10% of the atoms other than H, preferably <5% of the atoms other than H), such as, for example, $sp^a$-hybridised C, O, N, etc. These heteroaromatic ring systems can be monocyclic or polycyclic, i.e. they can contain one ring (for example pyridyl) or two or more rings, which may also be condensed or covalently linked, or contain a combination of condensed and linked rings.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups. Particular preference is given to imidazole, benzimidazole and pyridine.

The divalent aromatic or heteroaromatic unit having 5 to 40 ring atoms mentioned in connection with the formulae (4-1) and (4-2) is as defined above.

The terms "aryl radical" in connection with the formulae (4-1) and (4-2) are intended to have the same meaning as defined above.

"Aryloxy radical" is intended to be taken to mean a group in which an aryl radical as defined above is bonded via an oxygen atom.

A hydrocarbon radical having 1 to 20 C atoms in the present application is taken to mean a hydrocarbon radical as defined above, but having only 1 to 20 C atoms.

Likewise, the recurring units B and A can be a thiophene compound of the general formula (5):

$$\text{formula (5)}$$

where the following applies to the symbols and indices used:

$T^1$, $T^2$ are in each case, independently of one another, thiophene, selenophene, thieno[2,3b]thiophene, thieno[3,2b]thiophene, dithienothiophene or pyrrole, each of which may be substituted by one or more radicals $R^{11}$;

$R^{11}$ is on each occurrence, identically or differently, halogen, —CN, —NC, —NCO, —NCS, —OCN, —SCN, —C(=O)NR$^{12}$R$^{13}$, —C(=O)X, C(=O)X, —C(=O)R$^{12}$, —NH$_2$, —NR$^{12}$R$^{13}$, —SH, —SR$^{12}$, —SO$_3$H, —SO$_2$R$^{12}$, —OH, NO$_2$, —CF$_3$, —SF$_5$, optionally substituted silyl, a hydrocarbon radical having 1 to 40 C atoms, where one or more heteroatoms may be present and where two adjacent radicals $R^{12}$, together with the atoms/rings to which they are bonded, may optionally form a polycyclic ring system; where two $R^{11}$ together may also form a carbyl radical;

$R^{12}$, $R^{13}$ are in each case, independently of one another, H or an optionally substituted hydrocarbon radical having 1 to 40 C atoms, which may contain one or more heteroatoms, $Ar^4$, $Ar^y$ are in each case, independently of one another, a divalent aromatic or heteroaromatic unit, which is optionally substituted and may be bonded to the 2,3-position of one or more adjacent thiophene or selenophene groups;

c and e are, independently of one another, 0, 1, 2, 3 or 4 where: 1<c+e<6;

d and f are, independently of one another, 0, 1, 2, 3 or 4.

The terms "silyl", "hydrocarbon radical having 1 to 40 C atoms" and "divalent aromatic or heteroaromatic unit" in connection with formula (5) have the same meaning as defined above.

Likewise, the recurring units B and A, in particular B, can be a triarylamine compound of the general formula (6):

$$\text{formula (6)}$$

where the following applies to the symbols and indices used:

L is in each case, independently of one another, N, P, P=O, PF$_2$, P=S, As, As=O, As=S, Sb, Sb=O or Sb=S;

$Ar^6$ is on each occurrence, in each case independently of one another, a covalent single bond or a divalent aromatic or heteroaromatic unit;

$Ar^7$ is on each occurrence, in each case independently of one another, a divalent aromatic or heteroaromatic unit;

$Ar^8$ is on each occurrence, in each case independently of one another, a substituted or unsubstituted aromatic or heteroaromatic group, which may be substituted by a radical $R^{14}$, and/or which may be bridged to a further recurring unit of the general formula (6) via a divalent group;

$R^{14}$ is a straight-chain, branched or cyclic alkyl radical having 1 or 3 to 12 C atoms respectively or a straight-chain, branched or cyclic alkenyl radical having 2 or 3 to 12 C atoms respectively; $R^{14}$ is particularly preferably vinyl or sec-butyl; and w is 1, 2 or 3.

The terms "divalent aromatic or heteroaromatic unit", "aromatic or heteroaromatic group" and "straight-chain, branched or cyclic alkyl radical having 1 or 3 to 12 C atoms respectively" in connection with formula (6) have the same meaning as defined above.

A straight-chain, branched or cyclic alkenyl radical having 2 or 3 to 12 C atoms respectively is an alkyl radical in which one H atom is not present and the radical is bonded at this site.

In the composition according to the invention, it is particularly preferred that B is a triarylamine and A is indenofluorene, fluorene, spirobifluorene, phenanthrene or a derivative thereof. It is furthermore preferred that B is a phenanthrene or a derivative thereof and A is an indenofluorene or derivative thereof. The above-mentioned derivatives of these compounds are in each case preferred here.

Examples of preferred recurring units B are indicated in the following formulae (7) to (11):

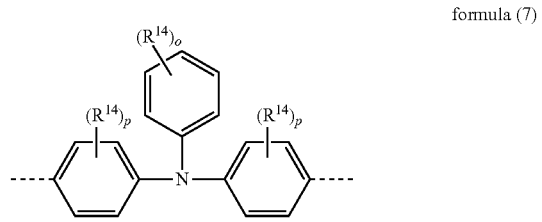
formula (7)

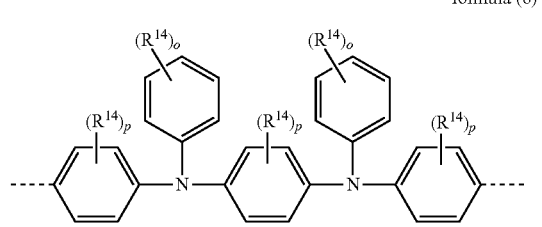
formula (8)

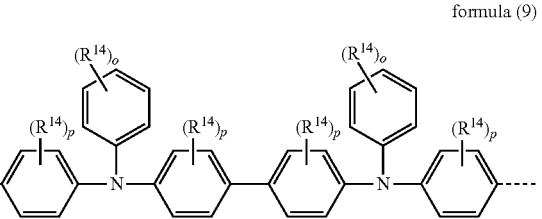
formula (9)

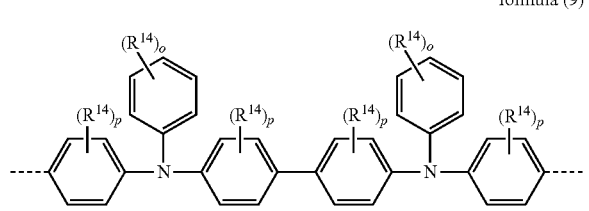
formula (10)

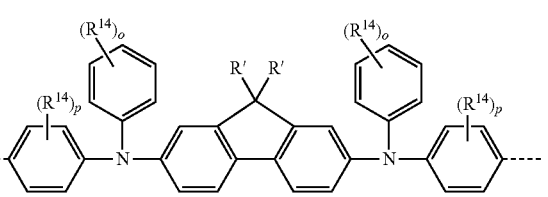

formula (11)

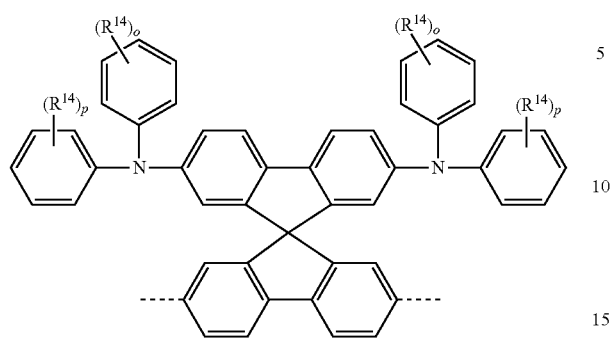

where

R$^{14}$ has, independently of one another, the same meaning as defined above;

R' has, independently of one another, the same meaning as defined above R$^2$ or R$^3$;

o is in each case, independently of one another, 0, 1 or 2, preferably 0 or 1; and p is in each case, independently of one another, 0, 1, 2, 3 or 4, preferably 0 or 1.

However, it is most preferred in the formula (6) that w is equal to 1, Ar$^6$ and Ar$^7$ is a phenylene unit and Ar$^8$ is a phenyl group, which is preferably substituted by an R$^{14}$ in the para-position.

Particularly preferred examples of the recurring unit B are the following:

formula (12)

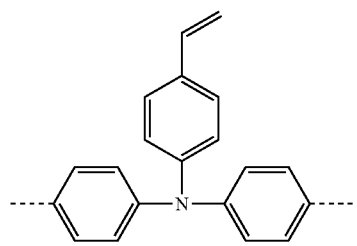

formula (13)

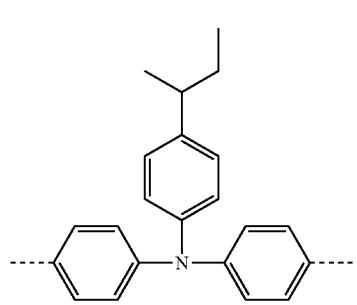

formula (14)

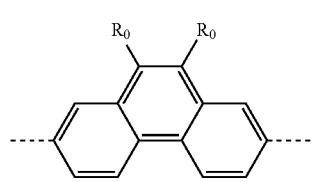

formula (15)

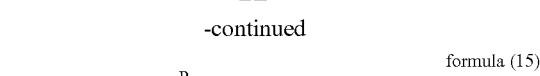

formula (16)

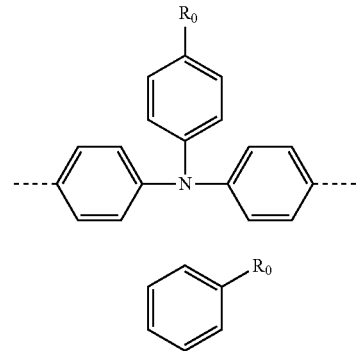

formula (17)

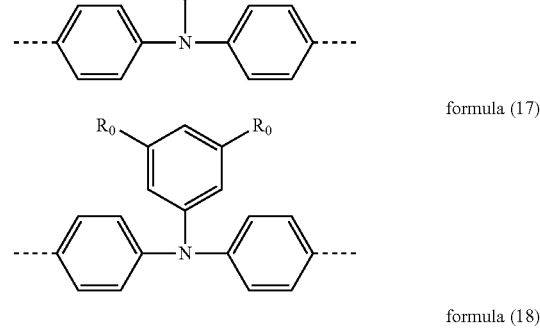

formula (18)

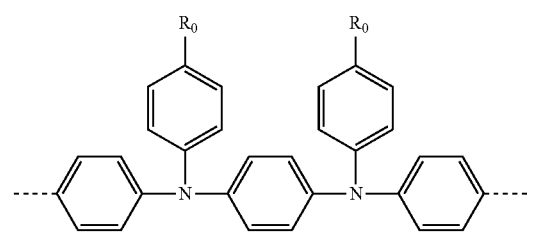

formula (19)

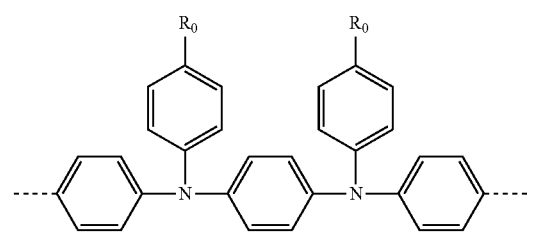

formula (20)

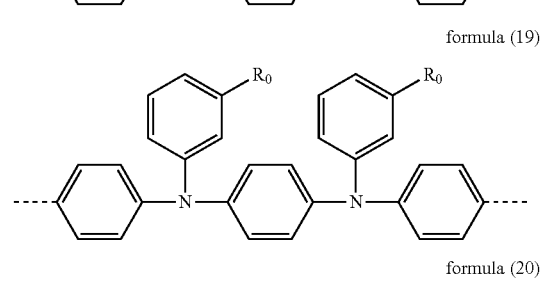

formula (21)

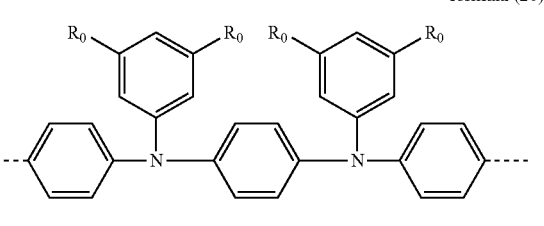

formula (22)
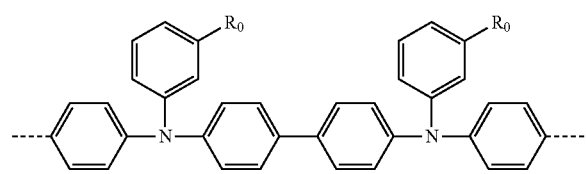
formula (23)
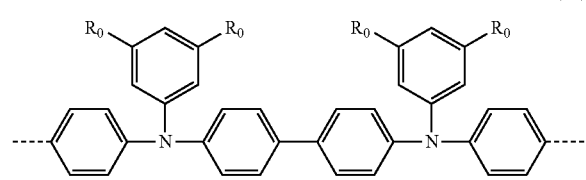
formula (24)
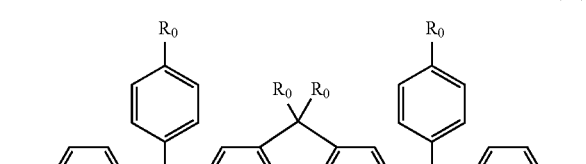
formula (25)
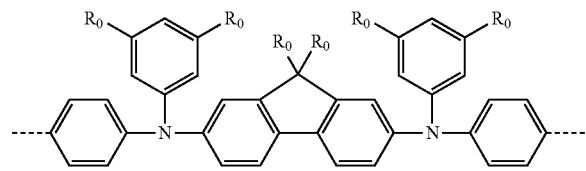
formula (26)
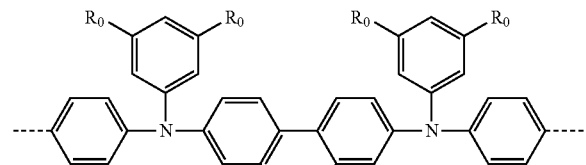
formula (27)
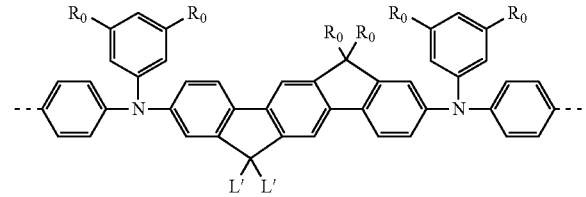
formula (28)
formula (29)
formula (30)
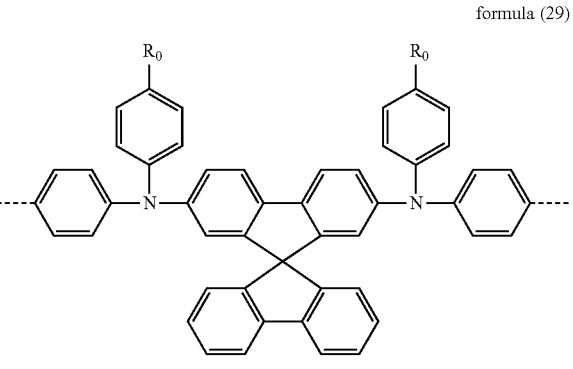
formula (31)
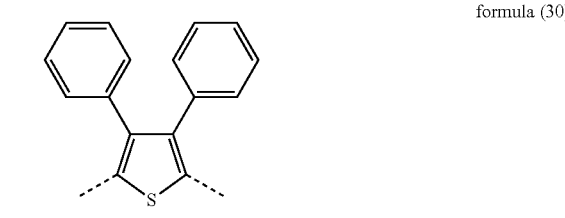
formula (32)
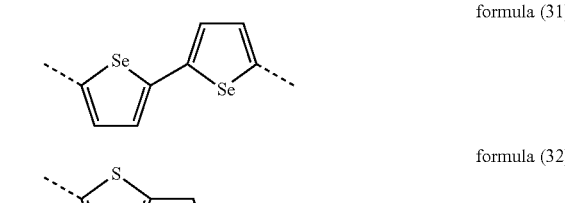
formula (33)
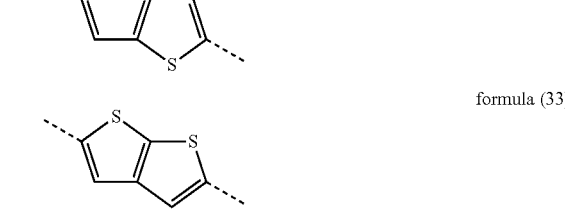
formula (34)
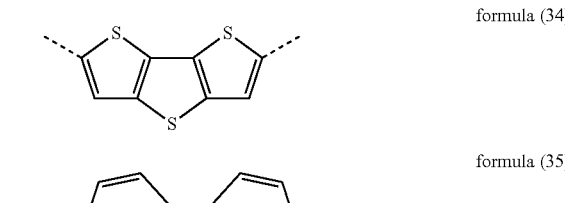
formula (35)
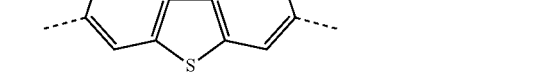

-continued

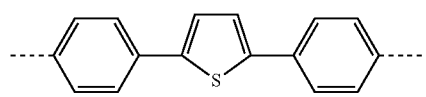
formula (36)

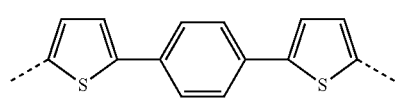
formula (37)

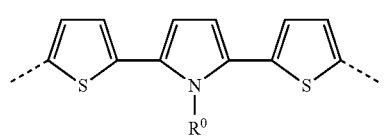
formula (38)

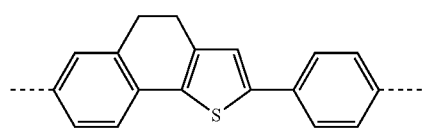
formula (39)

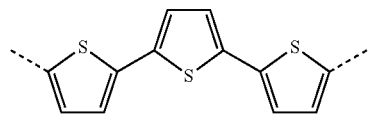
formula (40)

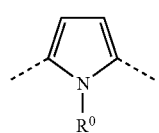
formula (41)

where $R^0$ is H, halogen or optionally a fluorinated, linear or branched alkyl or alkoxy group having 1 to 12 C atoms, $R^0$ is preferably H, F, methyl, i-propyl, t-butyl, n-pentoxy, or trifluoromethyl.

Particularly preferred examples of the recurring unit A are the following:

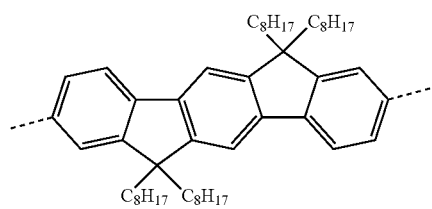
formula (42)

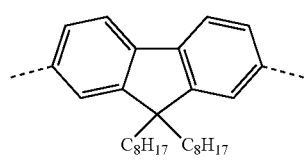
formula (43)

-continued

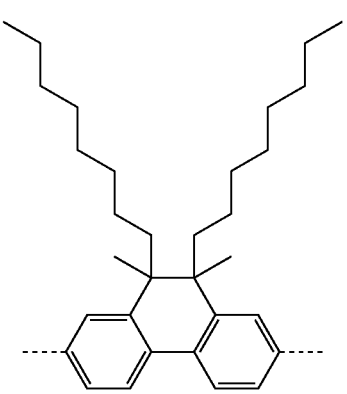
formula (44)

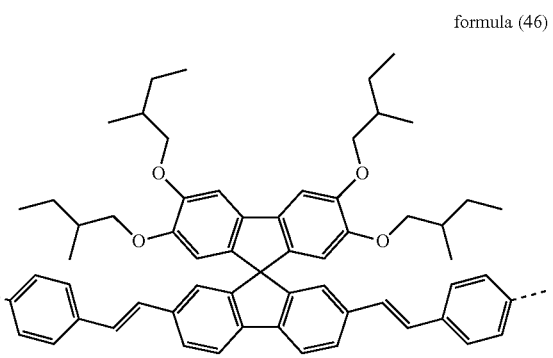
formula (45)

formula (46)

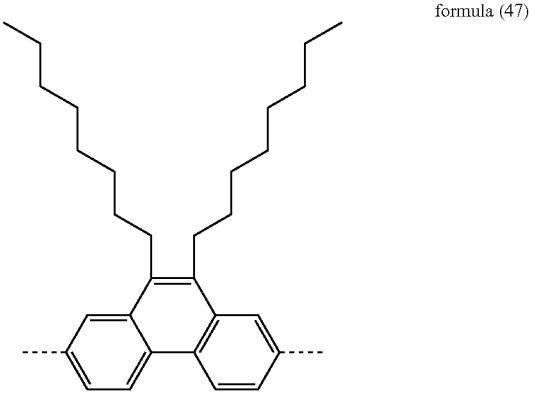
formula (47)

formula (48)
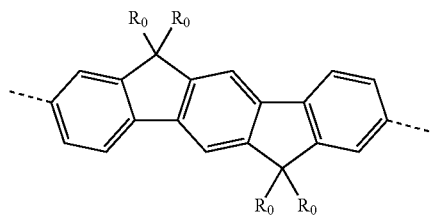

formula (49)
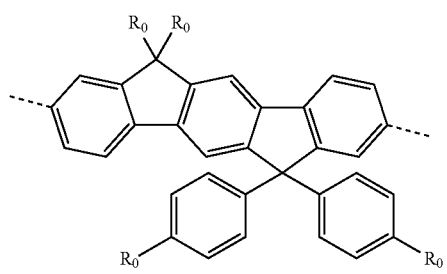

formula (50)
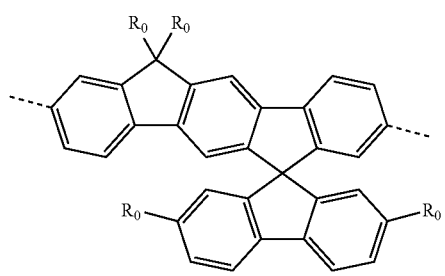

formula (51)
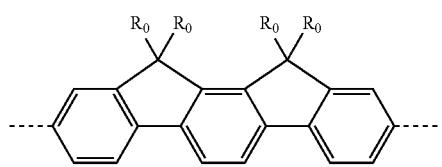

formula (52)

formula (53)
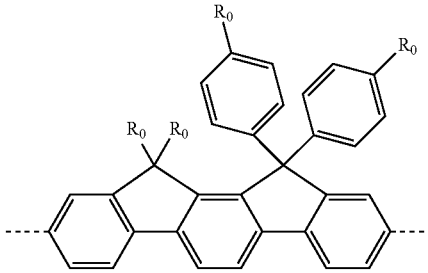

In accordance with the invention, particularly preferred conjugated polymers are the following combinations of recurring units:

polymer from formula (42), formula (12) and formula (13);
polymer from formula (43), formula (12) and formula (13);
polymer from formula (44), formula (12) and formula (13);
polymer from formula (45), formula (12) and formula (13);
polymer from formula (46), formula (12) and formula (13);
polymer from formula (47), formula (12) and formula (13);
polymer from formula (48), formula (12) and formula (13);
polymer from formula (49), formula (12) and formula (13);
polymer from formula (50), formula (12) and formula (13);
polymer from formula (51), formula (12) and formula (13);
polymer from formula (52), formula (12) and formula (13);
polymer from formula (53), formula (12) and formula (13);
polymer from formula (42) and formula (42);
polymer from formula (42) and formula (43);
polymer from formula (42) and formula (44);
polymer from formula (42) and formula (45);
polymer from formula (42) and formula (46);
polymer from formula (42) and formula (47);
polymer from formula (42) and formula (52);
polymer from formula (42) and formula (53);
polymer from formula (42) and formula (13);
polymer from formula (43) and formula (13);
polymer from formula (44) and formula (13);
polymer from formula (45) and formula (13);
polymer from formula (46) and formula (13);
polymer from formula (47) and formula (13);
polymer from formula (42) and formula (16);
polymer from formula (42) and formula (18);
polymer from formula (42) and formula (20);
polymer from formula (42) and formula (22);
polymer from formula (42) and formula (24);
polymer from formula (42) and formula (26);
polymer from formula (42) and formula (28);
polymer from formula (42) and formula (30);
polymer from formula (42) and formula (32);
polymer from formula (42) and formula (33);
polymer from formula (42) and formula (34).

The polymers employed in the composition according to the invention are generally prepared by polymerisation of monomer types, of which at least one monomer results in recurring units A in the polymer and at least one monomer results in recurring units B in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 2003/048225 A2, WO 2004/037887 A2 and WO 2004/037887 A2.

The C—C linking reactions are preferably selected from the group of SUZUKI coupling, YAMAMOTO coupling and STILLE coupling; the C—N linking reaction is preferably a HARTWIG-BUCHWALD coupling.

The dendrimers according to the invention can be prepared by processes known to the person skilled in the art or analogously thereto. Suitable processes are described in the literature, for example in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

In the composition according to the invention, the doping compound is preferably an ionic compound of the formula $G^+A^-$, where $G^+$ and $A^-$ have the following meanings:

$A^-$ is selected from the group of anions which consists of $[HSO_4]^-$, $[SO_4]^{2-}$, $[NO_3]^-$, $[BF_4]^-$, $[(R_F)BF_3]^-$, $[(R_F)_2BF_2]^-$, $[(R_F)_3BF]^-$, $[(R_F)_4B]^-$, $[B(CN)_4]^-$, $[PO_4]^{3-}$, $[HPO_4]^{2-}$, $[H_2PO_4]^-$, $[alkyl-OPO_3]^{2-}$, $[(alkyl-O)_2PO_2]^-$, $[alkyl-PO_3]^{2-}$, $[R_FPO_3]^{2-}$, $[(alkyl)_2PO_2]^-$, $[(R_F)_2PO_2]^-$, $[R_FSO_3]^-$, $[HOSO_2(CF_2)_kSO_2O]^-$, $[OSO_2(CF_2)_kSO_2O]^{2-}$, $[alkyl-SO_3]^-$, $[HOSO_2(CH_2)_kSO_2O]^-$, $[OSO_2(CH_2)_k SO_2O]^{2-}$, $[alkyl-OSO_3]^-$, $[alkyl-C(O)O]^-$, $[HO(O)C(CH_2)_kC(O)O]^-$, $[R_FC(O)O]^-$, $[HO(O)C(CF_2)_kC(O)O]^-$, $[O(O)C(CF_2)_kC(O)O]^{2-}$, $[(R_FSO_2)_2N]^-$, $[(FSO_2)_2N]^-$, $[((R_F)_2P(O))_2N]^-$, $[(R_FSO_2)_3C]^-$, $[(FSO_2)_3C]^-$, Cl$^-$ and/or Br$^-$, $PF_6^-$, $[PF_3(C_2F_5)_3]^-$, $[PF_3(CF_3)_3]^-$, $[B(COO-COO)_2]^-$, $[(CF_3SO_2)_2N]^-$, $[(C_2F_5SO_2)_2N]^-$, $[(CF_3SO_2)(C_4F_9SO_2)N]^-$, $[(CN)_2N]^-$, $[CF_3SO_2]_3C]^-$, and $[(CN)_3C]^-$;

where
k is an integer from 1 to 8; and
$R_F$ is a fluorinated aryl or alkylaryl radical or a fluorinated alkyl radical of the formula $(C_oF_{2o-p+1}H_p)$, in which o is an integer from 1 to 12 and p is an integer from 0 to 7, where $R_F$ is preferably $CF_3$, $C_2F_5$, $C_3F_7$ or $C_4F_9$.

The above-mentioned alkyl radical is preferably selected from a straight-chain alkyl radical having 1 to 20 C atoms and a branched alkyl radical having 3 to 20 C atoms, where the maximum number of C atoms is in each case preferably 14 or even more preferably 4. The terms "aryl radical", "alkylaryl radical" or "alkyl radical" are otherwise as defined above.

$G^+$ is selected from the group of cations which consists of alkali (preferably Li$^+$, Na$^+$ and K$^+$) and alkaline-earth metal ions, ammonium, phosphonium, thiouronium, thioxonium, guanidinium cations, heterocyclic cations and derivatives thereof;

Preferred examples of the ammonium, phosphonium, thiouronium, guanidinium cations and derivatives thereof are shown in the following formulae (54) to (58) and more preferred examples of heterocylic cations are shown in the formulae (59) to (86):

formula (54)

formula (55)

formula (56)

formula (57)

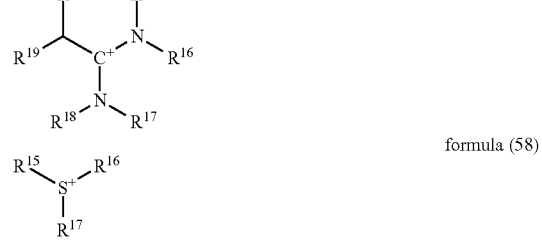

formula (58)

where
$R^{15}$ to $R^{20}$ are in each case selected, independently of one another, from a straight-chain alkyl radical having 1 to 20 C atoms and a branched alkyl radical having 3 to 20 C atoms, a straight-chain or branched alkenyl radical having 2 or 3 to 20 C atoms respectively and one or more non-conjugated double bonds, a straight-chain or branched alkynyl radical having 2 or 3 to 20 C atoms respectively and one or more non-conjugated double bonds, a saturated, partially saturated or fully saturated cycloalkyl radical having 3 to 7 C atoms, which may be substituted by further alkyl radicals having 1 to 6 C atoms, where one more of the radicals $R^{15-20}$ may be partially or fully substituted by —F and/or —Cl, or partially substituted by —OR', —CN, —C(O)OH, —C(O)NR'$_2$, —SO$_2$NR'$_2$, —SO$_2$OH, —SO$_2$X, —NO$_2$, where one or more non-adjacent and non-a-carbon atoms from $R^{15}$ to $R^{20}$ may also be substituted by a group which is selected from —O—, —S—, —S(O)—, —SO$_2$—, —N$^+$R"$_2$, —C(O)NR"—, —SO$_2$NR"—, and —P(O)R"—, where R" is equal to H, an alkyl radical having 1 to 6 C atoms or cycloalkyl radical having 3 to 7 C atoms which is unsubstituted, partially substituted or fully substituted by —F, and unsubstituted or substituted phenyl, and X is equal to halogen. The term "alkyl radical" has the same meaning as defined above. An alkenyl radical or alkynyl radical is taken to mean alkyl radicals which contain a C—C double bond or a C—C triple bond.

In the formula (54), $R^{15}$ to $R^{18}$ may be H, with the proviso that at least one of the radicals $R^{15}$ to $R^{18}$ is not H. In the formula (55), $R^{15}$ to $R^{18}$ may be H and $NR''_2$, where R" is as defined above. In the formula (56), $R^{15}$ to $R^{19}$ may be H. In the formula (57), $R^{15}$ to $R^{20}$ may be H, CN and $NR'_2$, where R" is as defined above.

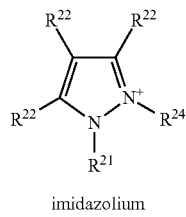

formula (59)

imidazolium

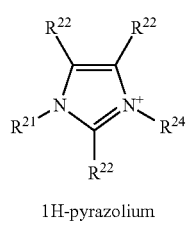

formula (60)

1H-pyrazolium

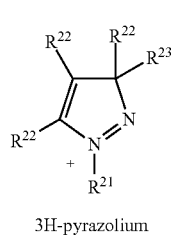

formula (61)

3H-pyrazolium

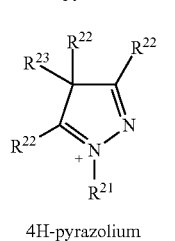

formula (62)

4H-pyrazolium

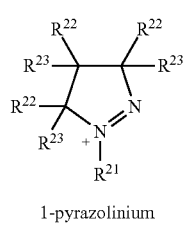

formula (63)

1-pyrazolinium

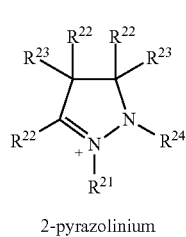

formula (64)

2-pyrazolinium

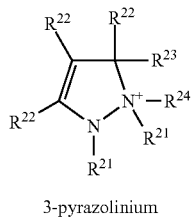

formula (65)

3-pyrazolinium

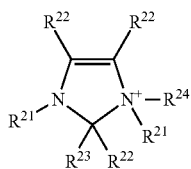

formula (66)

2,3-dihydroimidazolinium

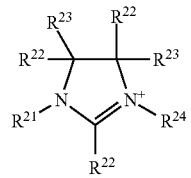

formula (67)

4,5-dihydroimidazolinium

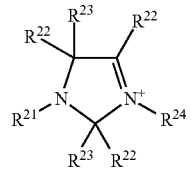

formula (68)

2,5-dihydroimidazolinium

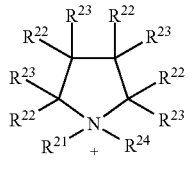

formula (69)

pyrrolidinium

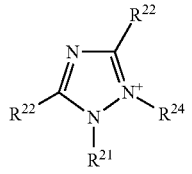

formula (70)

1,2,4-triazolium

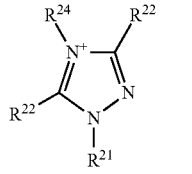

formula (71)

1,2,4-triazolium

-continued
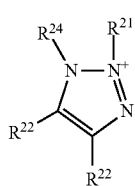
1,2,3-triazolium
formula (72)
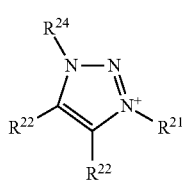
1,2,3-triazolium
formula (73)
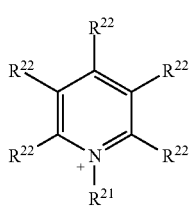
pyridinium
formula (74)
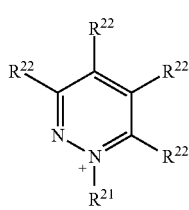
pyridazinium
formula (75)
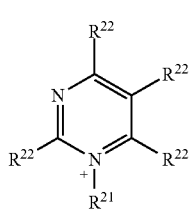
pyrimidinium
formula (76)
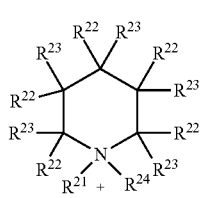
piperidinium
formula (77)
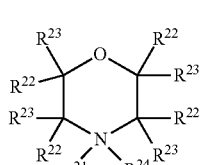
morpholinium
formula (78)
-continued
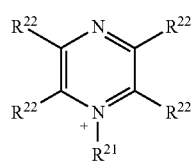
pyrazinium
formula (79)
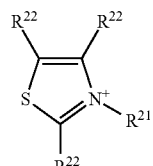
thiazolium
formula (80)
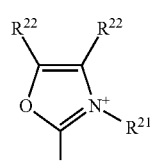
oxazolium
formula (81)
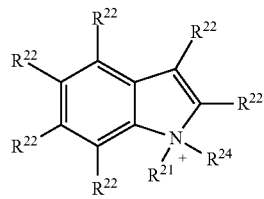
indolium
formula (82)
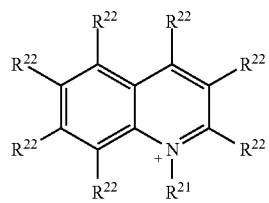
quinolinium
formula (83)
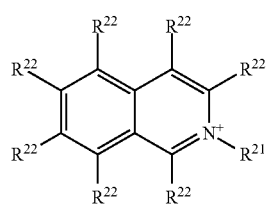
isoquinolinium
formula (84)
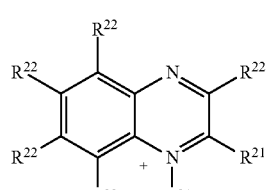
quinoxalinium
formula (85)

-continued

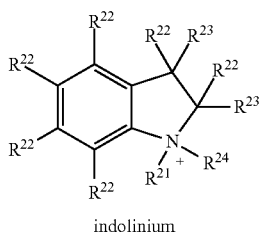

formula (86)

indolinium where the substituents $R^{21}$ to $R^{24}$ are selected, in each case independently of one another, from H, CN, a straight-chain or branched alkyl radical having 1 or 3 to 20 C atoms respectively, a straight-chain or branched alkenyl radical having 2 or 3 to 20 C atoms respectively and one or more non-conjugated double bonds, a straight-chain or branched alkynyl radical having 2 or 3 to 20 C atoms respectively and one or more non-conjugated triple bonds, a partially or fully unsaturated cycloalkyl radical having 3 to 7 C atoms, which may be substituted by an alkyl radical having 1 to 6 C atoms, a saturated or partially or fully unsaturated aryl radical, arylalkyl radical, or alkyl radical, where the substituents $R^{21}$, $R^{22}$, $R^{23}$ and/or $R^{24}$ together may form a ring, where one or more of the substituents $R^{21}$ to $R^{24}$ may be partially or fully substituted by a halogen, in particular by —F and/or —Cl, —OR", —CN, —C(O)OH, —C(O)NR"$_2$, —SO$_2$NR"$_2$, —C(O)X, —SO$_2$OH, —SO$_2$X or —NO$_2$, where the substituents $R^{21}$ and $R^{24}$ are not both substituted by halogen in a compound, where one or two carbon atoms of the substituents $R^{21}$ and $R^{22}$ which are not adjacent or are not bonded to a heteroatom may be substituted by a group which is selected from —O—, —S—, —S(O)—, —SO$_2$—, —N$^+$R"$_2$—, —C(O)NR"—, —SO$_2$NR"— and —P(O)R"—, where R" is equal to H, an alkyl radical having 1 to 6 C atoms or cycloalkyl radical having 3 to 7 C atoms which is unsubstituted, partially substituted or fully substituted by F, or unsubstituted or substituted phenyl, and X is equal to halogen. The terms "alkyl radical", "aryl radical" and "arylalkyl radical" here have the same meaning as defined above. An alkenyl radical or alkynyl radical is taken to mean alkyl radicals which contain a C—C double bond or a C—C triple bond.

$R^{22}$ is preferably selected from —OR", —NR"$_2$, —C(O)OH, —C(O)NR"$_2$, —SO$_2$NR"$_2$, —SO$_2$OH, —SO$_2$X and —NO$_2$.

Furthermore preferred mobile ions for G$^+$ are disclosed, for example, in US 2007/0262694 A1.

Even more preferred cations for the organic ion G$^+$ have a structure of the formula (87) depicted below. They include N,N,N-trimethylbutylammonium ion, N-ethyl-N,N-dimethylpropylammonium ion, N-ethyl-N,N-dimethylbutylammonium ion, N,N-dimethyl-N-propylbutylammonium ion, N-(2-methoxyethyl)-N,N-dimethylethylammonium ion, 1-ethyl-3-methyl imidazolium ion, 1-ethyl-2,3-dimethylimidazolium ion, 1-ethyl-3,4-dimethylimidazolium ion, 1-ethyl-2,3,4-trimethylimidazolium ion, 1-ethyl-2,3,5-trimethylimidazolium ion, N-methyl-N-propylpyrrolidinium ion, N-butyl-N-methylpyrrolidinium ion, N-sec-butyl-N-methylpyrrolidinium ion, N-(2-methoxyethyl)-N-methylpyrrolidinium ion, N-(2-ethoxyethyl)-N-methylpyrrolidinium ion, N-methyl-N-propylpiperidinium ion, N-butyl-N-methylpipridinium ion, N-sec-butyl-N-methylpiperidinium ion, N-(2-methoxyethyl)-N-methylpiperidinium ion and N-(2-ethoxyethyl)-N-methylpiperidinium ion.

formula (87)

Very particular preference is given here to N-methyl-N-propylpiperidinium.

Furthermore preferred cations G$^+$ of the organic ionic compound are selected in accordance with the present invention from the compounds of the general formulae (88) to (93)

formula (88)

formula (89)

formula (90)

formula (91)

formula (92)

formula (93)

where $R^{15}$ to $R^{18}$ are as defined in the formulae (54), (55) and (58), and $R^{21}$ and $R^{24}$ are as defined in the formulae (59), (73) and (69).

A further embodiment of the present invention relates to a formulation, for example a solution, dispersion or miniemulsion, in particular a solution, which comprises the composition according to the invention and a solvent.

The solvent in the composition according to the invention can be any solvent by means of which a solution, dispersion or miniemulsion can be prepared with the composition according to the invention.

Examples of suitable and preferred organic solvents include, without restriction, dichloromethane, trichloromethane, monochlorobenzene, o-dichlorobenzene, tetrahydrofuran, anisole, mesitylene, morpholine, toluene, o-xylene, m-xylene, p-xylene, 1,4-dioxane, acetone, methyl ethyl ketone, 1,2-dichloroethane, 1,1,1-trichloroethane, 1,1,2,2-tetrachloroethane, ethyl acetate, n butyl acetate, dimethylacetamide, tetralin, decalin, indane, cyclohexanone, dimethylformamide (DMF), dimethyl sulfoxide (DMSO), propylene carbonate, dichloromethane (DCM), tetrahydrofuran (THF), ethyl acetate, acetone, acetonitrile, formic acid, n-butanol, isopropanol, n-propano, acetic acid, ethanol, methanol and/or mixtures thereof.

The formulation according to the invention preferably comprises a polar solvent, particularly preferably cyclohexanone, dimethylformamide (DMF), dimethyl sulfoxide (DMSO), propylene carbonate, formic acid and n-butanol.

The concentration of the composition in the solution is preferably 0.1 to 10% by weight, very preferably 0.5 to 5% by weight, based on the total weight of the solution. The solution may optionally also comprise one or more binders in order to establish the rheological properties, as described in WO 2005/055248 A1 and WO 2011/076325.

Solvent mixtures (solvent blends) can also be used and identified as described in "Solvents, WHEllis, Federation of Societies for Coatings Technology, p 9-10, 1986". A procedure of this type may result in a mixture of non-solvents which dissolves the composition, although it is desirable to have at least one true solvent in a blend.

A further preferred embodiment of the formulation is a dispersion or an emulsion, where a miniemulsion is very preferred, heterophase systems, in which a discontinuous phase which includes solid nanoparticles or stable nanodroplets is dispersed in a second continuous phase. The present invention relates to a dispersion or an emulsion, where the various components of the composition are located either in the same phase or in the different phases. Preferred distributions are as follows:

1) the majority or all hole-transport compounds are located in the discontinuous phase and the majority or all ionic compounds are located in the continuous phase;

2) the majority or all ionic compounds are located in the discontinuous phase and the majority or all hole-transport compounds are located in the continuous phase;

3) the majority or all hole-transport compounds are located in the discontinuous phase and at least some of the ionic compounds are located in the interface between two phases.

The following two formulations, 1) dispersion or emulsion in which the continuous phase is a polar phase, and 2) dispersion or inverse miniemulsion in which the continuous phase is a non-polar phase, have been used in the present invention. The preferred formulation is the dispersion or miniemulsion having a polar continuous phase. In order to increase the kinetic stability of the dispersion or emulsion, one or more surfactants can be added. The choice of the solvents, surfactants and the processing in order to be able to prepare a stable dispersion or miniemulsion does not present the person skilled in the art with any difficulties, also to the area. Examples thereof are disclosed in the prior art, such as, for example, by Landfester et al. (Annu. Re. Mater. Res. 2006, 36, 231).

The formulations according to the invention are preferably used in order to produce thin layers. The coating of devices, such as, for example, of OLEDs, from solution is preferred over coating by means of vacuum deposition. Preferred coating techniques include, without restriction, dip coating, spin coating, ink-jet printing, letterpress printing, screen printing, knife coating, roller printing, reverse roller printing, offset printing, flexographic printing, gravure printing, roller printing, spray coating, brushing or pad printing, slot-die coating. Ink-jet printing processes are particularly preferred here, since they enable the production of high-resolution displays. The present invention therefore also relates to so-called thin layers which comprise or consist of the composition according to the invention.

The composition or formulation according to the invention is suitable, in particular, for the production of films or coatings, in particular for the production of structured coatings, for example by thermal or light-induced crosslinking of crosslinkable groups in the composition according to the invention.

The present invention also relates to the use of the composition according to the invention in an electronic device. The present invention likewise also relates to the use of a formulation according to the invention in the production of an electronic device. The electronic devices are preferably organic electronic devices, in particular organic or polymeric organic electroluminescent devices (OLED, PLED), organic field-effect transistors (OFETs), organic integrated circuits (OICs), organic thin-film transistors (OTFTs), organic light-emitting transistors (OLETs), coating or thin layer for antistatics, organic solar cells (OSCs), organic optical detectors, organic laser diodes (O-lasers), organic field-quench devices (OFQDs), light-emitting electrochemical cells (LECs), "organic plasmon emitting devices" and organic photovoltaic (OPV) elements or devices or organic photoreceptors (OPCs), particularly preferably organic or polymeric organic electroluminescent devices (OLED, PLED), in particular polymeric organic electroluminescent devices (PLED).

In a preferred embodiment, the composition according to the invention is in the form of a thin layer in electronic devices as described above and below. For the purposes of this invention, thin layer is taken to mean a layer having a thickness in the range from 1 nm to 100 μm, preferably in the range from 2 nm to 10 μm, very preferably in the range from 3 nm to 1 μm and very particularly preferably in the range from 5 nm to 0.1 μm.

Accordingly, the present invention also relates to an electronic device which comprises an anode, a cathode, an active layer and a buffer layer between anode and the active layer, characterised in that the buffer layer comprises a composition according to the invention.

The active layer of the electronic device according to the invention can be a light-emitting layer or a charge-generation layer.

For the purposes of the present invention, a charge-generation layer is taken to mean a layer which absorbs photons and then, if necessary with the aid of an electric field, is able to generate free charge carriers. The photon energy can be in the UV to IR region. An electronic device comprising a charge-generation layer of this type includes: 1) organic photovoltaic cells (Bundgaard et al., Solar Energy Materials & Solar Cells 91 (2007) 954-985); 2) dye-sensitised solar cells (DSSCs) (Grätzel in J. Photochem. Photobiol. C: Photochem. Reviews, 4, 145 (2003)); 3) organic photoreceptors (OPCs) having a "charge generation layer" ("Organic Photoreceptors for Xerography", by Paul M. Borsenberger and David S. Weiss, Marcel. Dekker, Inc. (1998)); 4) organic photodiodes (Campbell et al., Appl. Phys. Lett. 95, 263302 (2009)).

A light-emitting layer (EML) is a layer which preferably emits light in the visible region. The light-emitting layer may consist of one layer or of a plurality of layers. If a plurality of emission layers are present, these preferably have in total a plurality of emission maxima between 380 nm and 750 nm, resulting overall in white emission, i.e. various emitting compounds which are able to fluoresce or phosphoresce (phosphorescent or fluorescent emitter compound) are used in the emitting layers. Particular preference is given to systems having three emitting layers, where the three layers exhibit blue, green and orange or red emission (for the basic structure see, for example, WO 2005/011013). It is possible here for all emitting layers to be fluorescent layers or for all emitting layers to be phosphorescent layers or for one or more emitting layer(s) to be (a) fluorescent layer(s) and one or more other layer(s) to be (a) phosphorescent layer(s).

A fluorescent compound in the sense of this invention is a compound which exhibits luminescence from an excited singlet state at room temperature. For the purposes of this invention, all luminescent compounds, in particular, which contain no heavy atoms, i.e. no atoms having an atomic number greater than 36, are to be regarded as fluorescent compounds. A large number of known fluorescent compounds are known to the person skilled in the art from the prior art from which he will be able to make a selection without difficulties and without being inventive.

Phosphorescent emitter compounds are particularly preferably employed in the light-emitting layer. A phosphorescent emitter compound is generally taken to mean a compound which exhibits luminescence from an excited state having relatively high spin multiplicity. Relatively high spin multiplicity is present if the spin quantum number S is greater than or equal to 1. Phosphorescence is accordingly present in the case of emission from a triplet state (S=1, 2S+1=3; triplet emitter), from an MLCT mixed state or a quintet state (S=2; quintet emitter).

Suitable phosphorescent emitter compounds are, in particular, compounds which emit light, preferably in the visible region, on suitable excitation and in addition contain at least one atom of atomic numbers >38 and <84, particularly preferably >56 and <80. Preferred phosphorescence emitters are compounds which contain copper, molybdenum, tungsten, rhenium, ruthenium, osmium, rhodium, iridium, palladium, platinum, silver, gold or europium, in particular compounds which contain iridium, platinum or copper. Examples of the emitters described above are revealed by the applications WO 00/70655, WO 01/41512, WO 02/02714, WO 02/15645, EP 1191613, EP 1191612, EP 1191614, WO 2005/033244. In general, all phosphorescent complexes as are used in accordance with the prior art for phosphorescent OLEDs and as are known to the person skilled in the art in the area of organic electroluminescence are suitable.

Particularly preferred organic electronic devices comprise, as phosphorescent emitter compounds, at least one compound of the formulae (94) to (97),

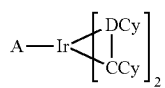
formula (94)

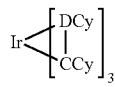
formula (95)

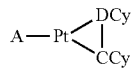
formula (96)

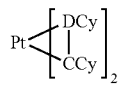
formual (97)

where:
DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^{25}$; the groups DCy and CCy are connected to one another via a covalent bond;
CCy is, identically or differently on each occurrence, a cyclic group which contains a carbon atom via which the cyclic group is bonded to the metal and which may in turn carry one or more substituents $R^{25}$;
A is, identically or differently on each occurrence, a monoanionic, bidentate-chelating ligand, preferably a diketonate ligand; and
$R^{25}$ is, in each case independently of one another on each occurrence, defined like $R^6$.

A bridge between the groups DCy and CCy may also be present through the formation of ring systems between a plurality of radicals $R^{25}$.

The active materials, such as emitter compounds, are embedded in the active layer, preferably in a matrix material (host material).

The matrix material employed for triplet emitters can in general be all materials which are known to the person skilled in the art for this purpose from the prior art. It is preferred if the triplet level of the matrix material is higher than the triplet level of the emitter.

Suitable triplet matrix materials are, for example, ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diazasilole derivatives, for example in accordance with WO 2010/054729, diazaphosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, dibenzofuran derivatives, for example in accordance with WO 2009/148015, or bridged carbazole derivatives, for example in accordance with US 2009/0136779, WO 2010/050778, WO 2011/042107 or WO 2011/088877.

The matrix or host material employed for singlet emitters can in general be all materials which are known to the person skilled in the art for this purpose from the prior art. It is preferred if the singlet level of the matrix material is higher than the singlet level of the emitter.

Suitable singlet host materials for this purpose are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268) or the boronic acid derivatives (for example in accordance with WO 2006/117052). Particularly preferred host materials are selected from the classes of the oligoarylenes comprising naphthalene, anthracene and/or pyrene or atropisomers of these compounds, the oligoarylenevinylenes, the ketones, the phosphine oxides and the sulfoxides. Very particularly preferred host materials, apart from the compounds according to the invention, are selected from the classes of the oligoarylenes comprising anthracene and/or pyrene or atropisomers of these compounds, the phosphine oxides and the sulfoxides. An oligoarylene in the sense of this invention is intended to be taken to mean a compound in which at least three aryl or arylene groups are bonded to one another.

The cathode may be composed of various materials, as are used in accordance with the prior art. Examples of particularly suitable cathode materials are in general metals having a low work function, followed by a layer of aluminium or a layer of silver. Examples thereof are caesium, barium, calcium, ytterbium and samarium, in each case followed by a layer of aluminium or silver. Also suitable is an alloy of magnesium and silver.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal-oxide electrons (for example Al/Ni/NiO$_x$, Al/PtO$_x$) may also be preferred. For some applications, at least one of the electrodes must be transparent in order to facilitate either irradiation of the organic material or the coupling-out of light (OLED/PLED, O-lasers). A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The compositions and devices according to the invention are distinguished by the following surprising advantages over the prior art:
1. With the aid of the compositions according to the invention, the buffer layer and interlayer can be combined. Simpler devices are thus possible.
2. The ions used in the compositions enable the energy barrier at the anode to be minimised through the formation of an ionic double layer.
3. The compositions allow the production of cheaper devices. In particular, the compositions are suitable for reducing the costs in the context of mass production.
4. The compositions according to the invention furthermore allow the preparation of anhydrous formulations with organic solvents, so that the stability of electronic devices is increased.
5. The buffer layers in accordance with the present invention is more stable to electrons compared with the buffer layers from the prior art.
6. In principle, all metal can be used as anode in the devices according to the invention.

It should be pointed out that variations of the embodiments described in the present invention fall within the scope of this invention. Each feature disclosed in the present invention can, unless this is explicitly excluded, be replaced by alternative features which serve the same, an equivalent or a similar purpose. Thus, each feature disclosed in the present invention is, unless stated otherwise, to be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, are themselves inventive and are not merely to be regarded as part of the embodiments of the present invention. For these features, independent protection may be sought additionally or alternatively to each invention presently claimed.

The teaching regarding technical action disclosed with the present invention can be abstracted and combined with other examples.

The invention is explained in greater detail by the following figures and examples without wishing to restrict it thereby.

EXAMPLES

Example 1

Materials Used

Figure 1:
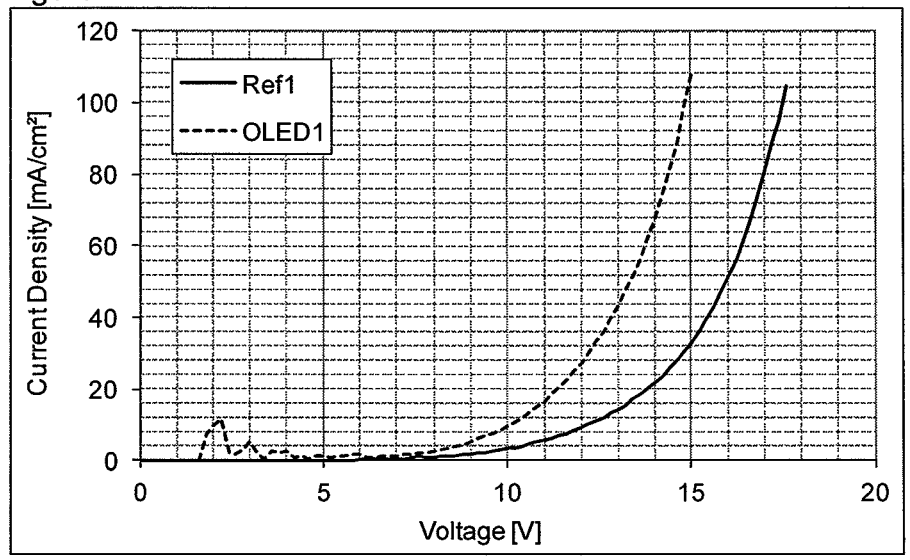
FIG. 1 shows the current density as a function of the voltage for OLED1 and Ref1.

For the production of an OLED without an electron-blocking interlayer, the following materials are employed for the production of an emitting layer:

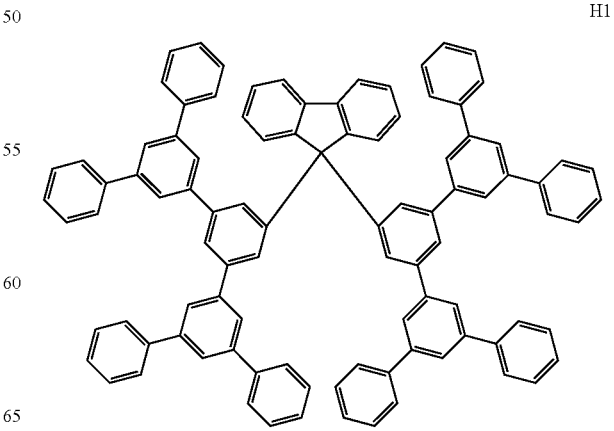

H1

H2

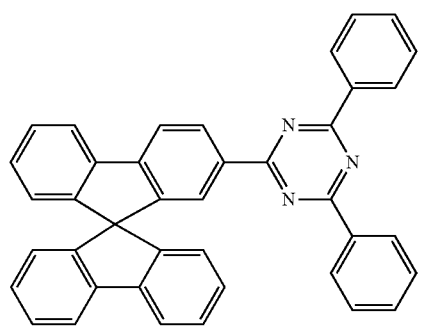

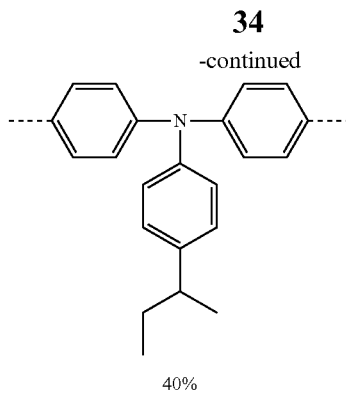

40%

TG1

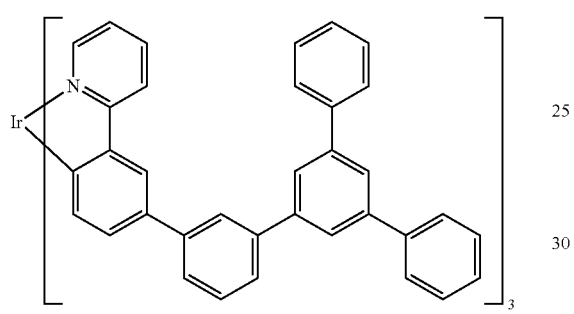

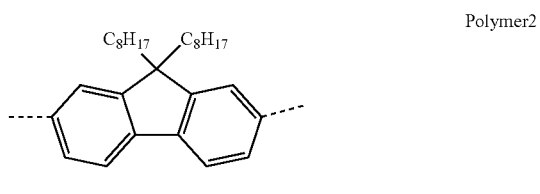

10%

H1 and H2 are host materials which can be synthesised in accordance with WO 2009/124627 and DE 102008036982. TG1 is a green triplet emitter which is synthesised in accordance with DE 102009041414.

The following materials are used for the production of the buffer layer:

The ion-conducting material used is poly(ethylene oxide) (PEO, average $M_v=1\times10^6$, Aldrich). Lithium trifluoromethanesulfonate (LiTrf, 99.995% metal basis; Aldrich) is used as ionic compound.

The following hole-transporting polymers are synthesised by SUZUKI coupling in accordance with WO 2003/048225, WO 2010/097155 and WO 2008/009343. The percentages indicated here are mol % of monomers. The molecular weight of all polymers is between 200,000 and 300,000 g/mol (GPC measurements: THF; 1 ml/min, Plgel 10 μm mixed-B 2×300×7.5 mm$^2$, 35° C., RI detection calibrated against polystyrene).

Polymer1

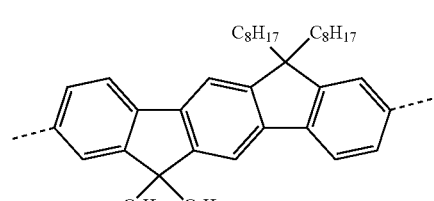

50%

Polymer2

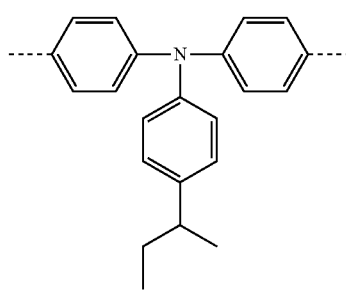

50%

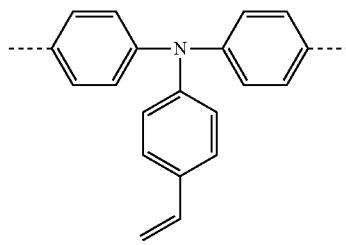

40%

10%

Polymer3
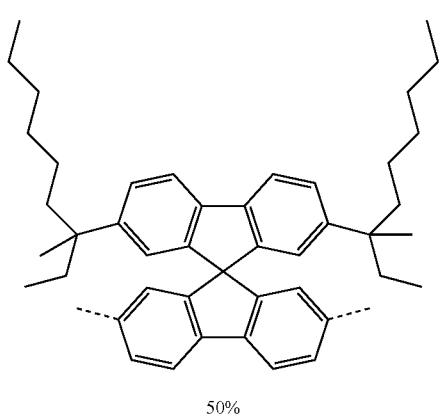
50%
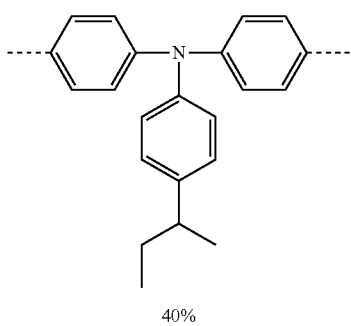
40%
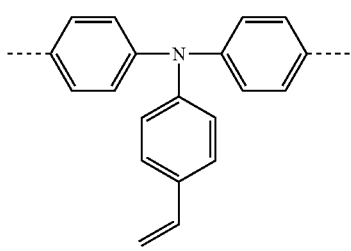
10%
Polymer4
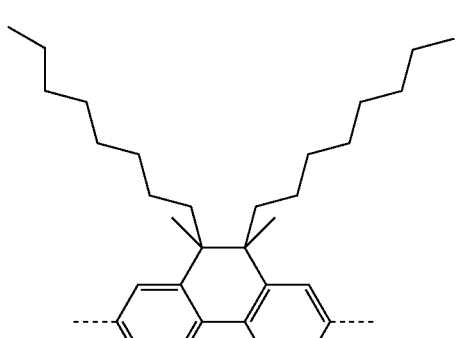
50%
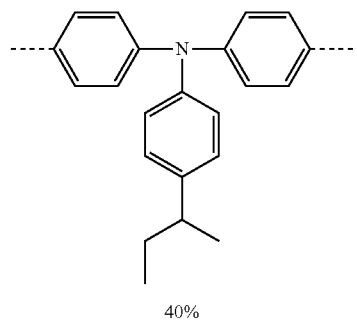
40%
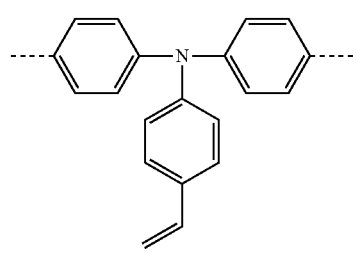
10%
Polymer5
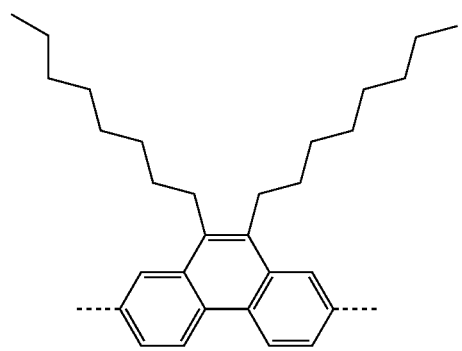
50%
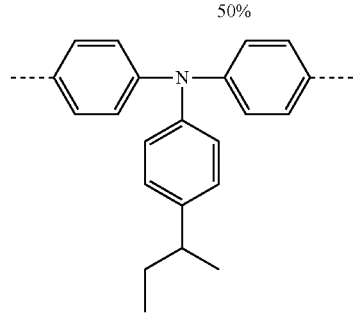
40%
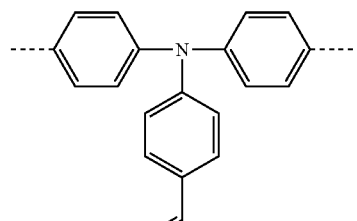
10%

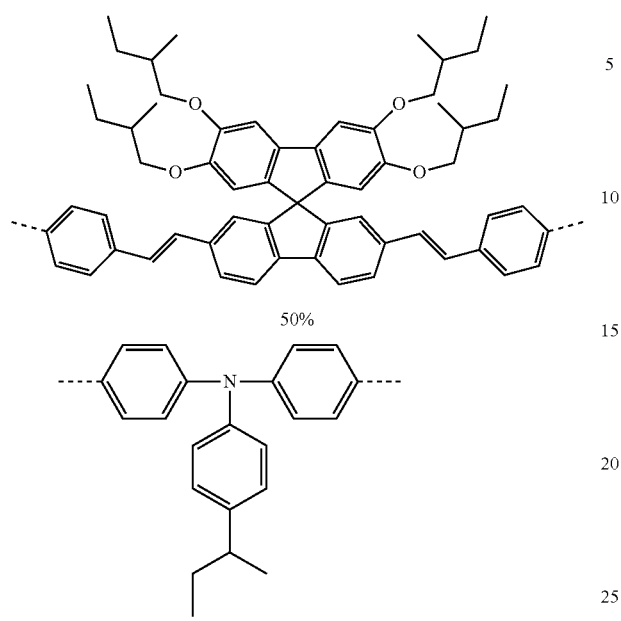

Polymer6

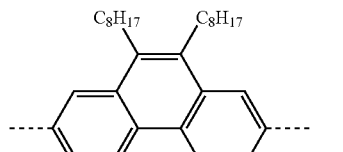

Polymer7

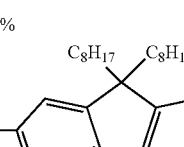

Polymer8

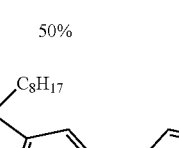

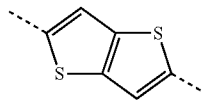

Polymer9

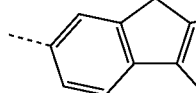

Example 2

Preparation the Formulations 9 different solutions are prepared whose composition are indicated in Table 1. To this end, firstly 100 mg of the constituents indicated in the "Composition" column in the ratio indicated are dissolved in 10 ml of cyclohexanone (purity 99.90%) and stirred until the solution is clear. The solution is subsequently filtered using a Millipore Millex LS, hydrophobic PTFE 5.0 μm filter.

TABLE 1

| | Composition of the solutions | | |
|---|---|---|---|
| Solution | Composition | Ratio (based on weight) | Concentration |
| 1 | Polymer1 + PEO + LiTrf | 1:0.1:0.05 | 10 mg/ml |
| 2 | Polymer2 + PEO + LiTrf | 1:0.1:0.05 | 10 mg/ml |
| 3 | Polymer3 + PEO + LiTrf | 1:0.1:0.05 | 10 mg/ml |
| 4 | Polymer4 + PEO + LiTrf | 1:0.1:0.05 | 10 mg/ml |
| 5 | Polymer5 + PEO + LiTrf | 1:0.1:0.05 | 10 mg/ml |
| 6 | Polymer6 + PEO + LiTrf | 1:0.1:0.05 | 10 mg/ml |
| 7 | Polymer7 + PEO + LiTrf | 1:0.1:0.05 | 10 mg/ml |
| 8 | Polymer8 + PEO + LiTrf | 1:0.1:0.05 | 10 mg/ml |
| 9 | Polymer9 + PEO + LiTrf | 1:0.1:0.05 | 10 mg/ml |

Example 3

Production of the OLEDs

OLEDs 1 to 6 having an anode/buffer layer/EML/cathode structure, are produced as follows using Solutions 1 to 6 prepared under Example 2:
1) coating of an ITO-coated glass substrate with a buffer layer with a thickness of 80 nm by application of the solutions by spin coating in a glove box;
2) drying of the buffer layer by heating at 180° C. for 1 h in a glove box;
3) application of an emitting layer (EML) with a thickness of 80 nm to the buffer layer by spin coating of a solution in toluene of an H1(40 wt %)+H2(40 wt %)+TG1(20 wt %) mixture in a glove box;

4) drying of the device by heating at 180° C. for 10 min. in a glove box;
5) application of a Ba/Al cathode (3 nm+150 nm) by vapour deposition; and
6) encapsulation of the device.

Comparative Example

Reference OLEDs Ref1 to Ref6 are produced in the same way as under Example 3, with the only difference that, besides Polymers1-6, no further compounds are employed for the production of the buffer layer.
Furthermore, a further reference device, Ref0, can be produced using PEDOT as buffer layer. Ref0 is produced analogously to OLED1-6, where steps 1) and 2) are carried out as follows:
1) coating of an ITO-coated glass substrate with a PEDOT layer (Clevios™ P VP AI 4083) with a thickness of 80 nm as buffer layer by application of a dispersion by spin coating in a clean room;
2) drying of the buffer layer by heating at 180° C. for 10 min. in a clean room;

Example 4

Characterisation of the OLEDs

The OLEDs obtained in this way are characterised by standard methods which are well known to the person skilled in the art. The following properties are measured here: UIL characteristics, electroluminescence spectrum, efficiency and operating voltage. In particular, the efficiency is compared here at 1000 nits. The results are summarised in Table 2 below, where Ref1-6 serves as comparison, and Ref0 serves in accordance with the prior art.

TABLE 2

|  | Eff. @ 1 knits | V @ 1 knits |
|---|---|---|
| OLED1 | 19 | 9.5 |
| Ref1 | 0.95 | 17 |
| OLED2 | 20.1 | 9.1 |
| Ref2 | 1.2 | 16 |
| OLED3 | 21.2 | 9.3 |
| Ref3 | 1 | 17 |
| OLED3 | 23 | 8.8 |
| Ref3 | 0.8 | 16 |
| OLED4 | 18.5 | 8.6 |
| Ref4 | 2.1 | 19 |
| OLED5 | 24.3 | 8.5 |
| Ref5 | 3 | 17 |
| OLED6 | 17 | 10 |
| Ref6 | 0.6 | 16.6 |

Figure 2:
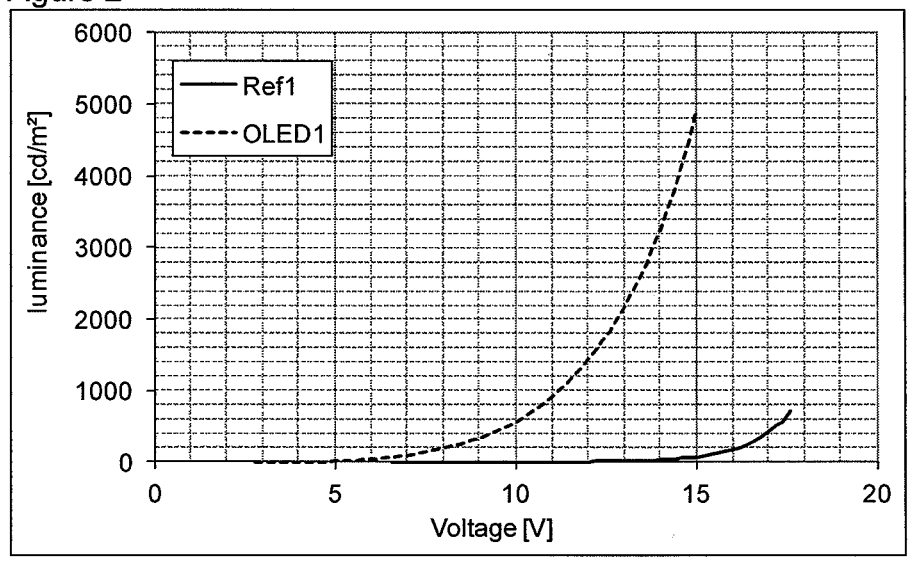
FIG. 2 shows the luminous density as a function of the voltage for OLED1 and Ref1.

REf0 gives an efficiency about 16 cd/A @ 1 knits.
FIGS. 1 and 2 shows the current density and luminous density of OLED1 and Ref1 as a function of the voltage.
Further optimisations by means of various possibilities can be achieved without inventive step on the basis of the present technical teaching according to the invention. Thus, a further optimisation may consist, for example, in using other ionic compounds, other co-matrices or other emitters.

Example 5

Conductive Layer Comprising Compositions Comprising Polymer7, Polymer8 and Polymer9

Polymer7, Polymer8 and Polymer9 are not crosslinkable polymers and are not incorporated into an OLED as buffer layer. A thin layer of 80 nm is applied to a glass substrate in a clean room by application of the solutions (Solution7-Solution9) by spin coating. For the production of a reference layer (80 nm), no further compounds are employed besides Polymers1-6. The conductivities of the layers is determined by a four-conductor measurement (4-point probes method). In each case, the thin layer comprising the compositions according to the invention is at least an order of magnitude higher than the corresponding reference layer.
Polymer7, Polymer8 and Polymer9 and the like can easily be modified to give crosslinkable polymers, so that they can also be utilised for other electronic device.

The invention claimed is:
1. An electronic device comprising:
an anode,
a cathode,
an active layer, and
a buffer layer between the anode and the active layer, wherein the buffer layer comprises at least one organic composition comprising:
a) a hole-transport compound,
b) an ion-conducting or proton-conducting compound, and
c) a doping compound selected from the group consisting of ionic compounds,
wherein the hole-transport compound is a conjugated polymer comprising polymer segments of formula (1) and/or polymer segments of a conjugated block co-polymer of formula (2):

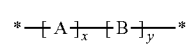  (1)

  (2)

wherein
A is a recurring unit selected on each occurrence, identically or differently, from the group consisting of phenylenevinylene, phenanthrene, dehydrophenanthrene, fluorene, spirobifluorene, benzofluorene, dibenzofluorene, indenofluorene, indolocarbazole, and derivatives thereof;
B is a recurring unit selected on each occurrence, identically or differently, from the group consisting of amine, triarylamine, thiophene, carbazole, phenanthrene, dehydrophenanthrene, fluorene, spirobifluorene, benzofluorene, dibenzofluorene, indenofluorene, indolocarbazoles, and derivatives thereof;
x and y
denote that the units A and B are in the form of recurring units in the conjugated polymer; and
q denotes that the unit -A-B— is a recurring unit in the polymer; and
wherein the doping compound is an ionic compound of formula $G^+A^-$, wherein
$G^+$ is a cation selected from the group consisting of $H^+$, alkali and alkaline-earth metal ions, ammonium, phosphonium, thiouronium, thioxonium, and guanidinium cations; and
$A^-$ is an anion selected from the group consisting of $[HSO_4]^-$, $[SO_4]^{2-}$, $[NO_3]^-$, $[BF_4]^-$, $[(R_F)BF_3]^-$, $[(R_F)_2BF_2]^-$, $[(R_F)_3BF]^-$, $[(R_F)_4B]^-$, $[B(CN)_4]^-$, $[PO_4]^{3-}$,

[HPO₄]²⁻, [H₂PO₄]⁻, [alkyl-OPO₃]²⁻, [(alkyl-O)₂PO₂]⁻, [alkyl-PO₃]²⁻, [R$_F$PO₃]²⁻, [(alkyl)₂PO₂]⁻, [(R$_F$)₂ PO₂]⁻, [R$_F$SO₃]⁻, [HOSO₂(CF₂)$_k$SO₂O]⁻, [OSO₂(CF₂)$_k$SO₂O]²⁻, [alkyl-SO₃]⁻, [HOSO₂(CH₂)$_k$SO₂O]⁻, [OSO₂(CH₂)$_k$SO₂O]²⁻, [alkyl-OSO₃]⁻, [alkyl-C(O)O]⁻, [HO(O)C(CH₂)$_k$C(O)O]⁻, [R$_F$C(O)O]⁻, [HO(O)C(CF₂)$_k$C(O)O]⁻, [O(O)C(CF₂)$_k$C(O)O]²⁻, [(R$_F$SO₂)₂N]⁻, [(FSO₂)₂N⁻, R(R$_F$)₂P(O))₂N]⁻, [(R$_F$SO₂)₃C]⁻, [(FSO₂)₃C]⁻, Cl⁻ and/or Br⁻, PF₆⁻, [PF₃(C₂F₅)₃]⁻, [PF₃(CF₃)₃]⁻, [B(COOCOO)₂]⁻, [(CF₃SO₂)₂ N]⁻, [(C₂F₅SO₂)₂N]⁻, [(CF₃SO₂)(C₄F₉SO₂)N]⁻, [(CN)₂N]⁻, [CF₃SO₂]₃C]⁻, and [(CN)₃C]⁻;

wherein
k is an integer from 1 to 8; and
R$_F$ is a fluorinated aryl or alkylaryl radical or a fluorinated alkyl radical of formula (C$_o$F$_{2o-p+1}$H$_p$), wherein o is an integer from 1 to 12 and p is an integer from 0 to 7; and wherein the active layer is an emitting layer or a charge-generation layer.

2. The device of claim 1, wherein the polymer is a crosslinked or uncrosslinked polymer.

3. The device of claim 1, wherein G⁺ is selected from the group consisting of R¹(PO₃²⁻)$_n$, R¹(PO₂⁻)$_n$, R¹(PO₃H⁻)$_n$, R¹(BO₂²⁻)$_n$, R¹(SO₂⁻)$_n$, R¹(—SO₃⁻)$_n$, R¹(COO⁻)$_r$, and R¹(BO₂H⁻)$_n$;

wherein
n is 0, 1, 2, 3, or 4;
r is greater than or equal to 1; and
R¹ is on each occurrence, identically or differently, an H, an amino group, an alkylamino group, a dialkylamino group, an arylamino group, a diarylamino group, or an alkylarylamino group.

4. The device of claim 1, wherein the recurring unit A is a fluorene, indenofluorene, spirobifluorene, phenanthrene, benzofluorene, dibenzofluorene, or a derivative thereof.

5. The composition of claim 1, wherein the recurring unit B is a triarylamine, a thiophene, a carbazole, a phenanthrene, or a derivative thereof.

6. The composition of claim 1, wherein the recurring unit A or B is a structural unit of formula (3):

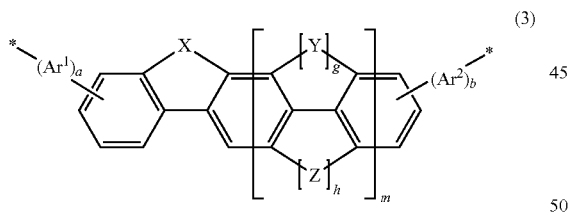

(3)

wherein
X, Y, and Z
are on each occurrence, independently of one another, a divalent group selected from the group consisting of —CR²R³, —NR²—, —PR²—, —O—, —S—, —SO₂—, —CO—, —CS—, —CSe—, —P(=O)R²—, —P(=S)R²—, and SiR²R³;

R² and R³
are on each occurrence, independently of one another, H, halogen, —CN, —NC, —NCO, —NCS, —OCN, —SCN, —C(=O)NR⁴R⁵, —C(=O)X, —C(=O)R⁴, —NH₂, —NR⁴R⁵, —SH, —SR⁴, —SO₃H, —SO₂R⁴, OH, —NO₂, —CF₃, —SF, optionally substituted silyl, or an optionally substituted hydrocarbon radical having 1 to 40 C atoms, which optionally comprises one or more heteroatoms, and wherein R² and R³ together optionally define a carbyl radical, or, together with the fluorene radical to which they are bonded, optionally define a spiro group;

R⁴ and R⁵
are on each occurrence, independently of one another, H or an optionally substituted hydrocarbon radical having 1 to 40 C atoms, which optionally comprise one or more heteroatoms, and wherein R⁴ and R⁵ together optionally define a carbyl radical;

g and h
are on each occurrence, in each case independently of one another, 0 or 1, wherein each h corresponding to g in the same unit is, differently to g, in each case 0 or 1;

X is halogen;
m is 0, 1, 2, or 3;

Ar¹ and Ar²
are on each occurrence, identically or differently, a divalent aromatic or heteroaromatic ring system having 5 to 40 ring atoms optionally substituted by one or more groups R², and wherein the ring system is optionally condensed onto positions 7,8 or 8,9 of the structural unit of formula (3); and a and b
are in each case, independently of one another, 0 or 1.

7. The device of claim 1, wherein the recurring unit A or B in formula (1) is a structural unit of formulae (4-1) or (4-2):

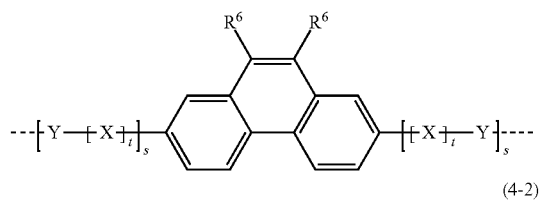

(4-1)

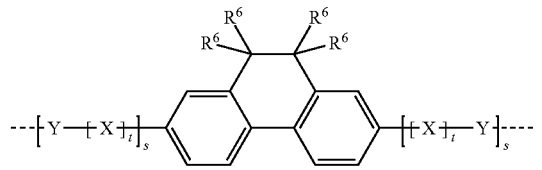

(4-2)

wherein
R⁶ is on each occurrence, identically or differently, H, a straight-chain, branched, or cyclic alkyl radical having 1 or 3 to 40 C atoms respectively, which are optionally substituted by a group R⁷, and wherein one or more non-adjacent C atoms are optionally replaced by N—R⁷, O, S, O—CO—O, CO—O, —CR⁷=CR⁷—, or —C≡C—, with the proviso that the heteroatoms are not bonded directly to the phenanthrene unit, and wherein one or more H atoms are optionally replaced by F, Cl, or CN, or an aromatic or heteroaromatic ring system having 6 or 5 to 40 ring atoms respectively, which are optionally substituted by one or more groups R⁷; and wherein two R⁶ optionally define a further mono- or polycyclic, aromatic or aliphatic ring system with one another; with the proviso that at least one $R^6$ group is in each case not H;

X is on each occurrence, identically or differently, —CR$^7$=CR$^7$—, —C≡C—, or N—Ar$^3$;

Y is on each occurrence, identically or differently, a divalent aromatic or heteroaromatic ring system having 6 or 5 to 40 ring atoms respectively, which are optionally substituted by one or more $R^7$ groups;

$R^7$ is on each occurrence, identically or differently, H, a straight-chain, branched, or cyclic alkyl or alkoxy radical having 1 or 3 to 22 C atoms respectively, wherein one or more non-adjacent C atoms are optionally replaced by N—$R^8$, O, S, O—CO—O, CO—O, —CR$^9$=CR$^9$—, or —C≡C, and wherein one or more H atoms are optionally replaced by F, Cl, or CN, or an aryl, heteroaryl, aryloxy, or heteroaryloxy group having 5 to 40 C atoms optionally substituted by one or more non-aromatic $R^7$ groups; and wherein two or more $R^7$ groups optionally define a ring system with one another and/or with an $R^6$ group; or F, Cl, CN, N($R^{10}$)$_2$, Si($R^{10}$)$_3$, or B($R^{10}$)$_2$;

$R^8$ is on each occurrence, identically or differently, H or a hydrocarbon radical having 1 to 20 C atoms;

$R^9$ is on each occurrence, identically or differently, H, a straight-chain, branched, or cyclic alkyl or alkoxy radical having 1 or 3 to 22 C atoms respectively, wherein one or more non-adjacent C atoms are optionally replaced by N—$R^8$, O, S, O—CO—O, CO—O, or —C≡C—, and wherein one or more H atoms are optionally replaced by F, Cl, Br, I, or CN, or an aryl or aryloxy radical having 5 to 40 C atoms optionally substituted by one or more non-aromatic $R^9$ groups; and wherein two or more $R^9$ groups optionally define a ring system with one another and/or with an $R^6$ or $R^7$; or F, Cl, CN, N($R^{10}$)$_2$, Si($R^{10}$)$_3$, or B($R^{10}$)$_2$;

$R^{10}$ is on each occurrence, identically or differently, H or an aliphatic or aromatic hydrocarbon radical having 1 to 20 C atoms;

Ar$^3$ is on each occurrence, identically or differently, an aromatic or heteroaromatic ring system having 6 or 5 to 40 C atoms respectively, which are optionally substituted by $R^7$ groups;

t is on each occurrence, identically or differently, 0 or 1;

s is on each occurrence, identically or differently, 0, 1, or 2; and wherein the dashed bond denotes the linking in the polymer.

8. The device of claim 1, wherein the recurring unit B in formula (1) is a compound of formula (5):

wherein $T^1$ and $T^2$
are in each case, independently of one another, thiophene, selenophene, thieno[2,3b]thiophene, thieno[3,2b]thiophene, dithienothiophene, or pyrrole, each of which are optionally substituted by one or more $R^{11}$ groups;

$R^{11}$ is on each occurrence, identically or differently, halogen, —CN, —NC, —NCO, —NCS, —OCN, —SCN, —C(=O)NR$^{12}$R$^{13}$, —C(=O)X, —C(=O)R$^{12}$, —NH$_2$, —NR$^{12}$R$^{13}$, —SH, —SR$^{12}$, —SO$_3$H, —SO$_2$R$^{12}$, —OH, NO$_2$, —CF$_3$, —SF$_5$, optionally substituted silyl, or a hydrocarbon radical having 1 to 40 C atoms and optionally one or more heteroatoms; wherein two adjacent $R^{11}$ groups, together with the atoms/rings to which they are bonded, optionally define a polycyclic ring system; and wherein two $R^{11}$ groups together optionally define a carbyl radical;

$R^{12}$ and $R^{13}$
are in each case, independently of one another, H or an optionally substituted hydrocarbon radical having 1 to 40 C atoms and optionally one or more heteroatoms;

Ar$^4$ and Ar$^y$
are in each case, independently of one another, an optionally substituted, divalent, aromatic or heteroaromatic unit, which is optionally bonded to the 2,3-position of one or more adjacent thiophene or selenophene groups;

c and e
are, independently of one another, 0, 1, 2, 3, or 4, wherein 1<c+e<6; and d and f
are, independently of one another, 0, 1, 2, 3, or 4.

9. The device of claim 1, wherein the recurring unit B in formula (1) is a triarylamine compound of formula (6):

wherein

L is in each case, independently of one another, N, P, P=O, PF$_2$, P=S, As, As=O, As=S, Sb, Sb=O, or Sb=S;

Ar$^6$ is on each occurrence, independently of one another, a covalent single bond or a divalent aromatic or heteroaromatic unit;

Ar$^7$ is on each occurrence, independently of one another, a divalent aromatic or heteroaromatic unit;

Ar$^8$ is on each occurrence, independently of one another, an optionally substituted aromatic or heteroaromatic unit, which is optionally substituted by a $R^{14}$ group, and/or which is optionally bridged to a further recurring unit of formula (6) via a divalent group;

$R^{14}$ is a straight-chain, branched, or cyclic alkyl radical having 1 or 3 to 12 C atoms respectively or a straight-chain, branched, or cyclic alkenyl radical having 2 or 3 to 12 C atoms respectively; and w is 1, 2, or 3.

10. The device of claim 1 wherein the at least one composition is in the form of a formulation further comprising a solvent.

11. The electronic device of claim 1, wherein said electronic device is selected from the group consisting of organic electroluminescent devices, polymeric electroluminescent devices, organic field-effect transistors, organic integrated circuits, organic thin-film transistors, organic light-emitting transistors, coating for antistatics, thin layer for antistatics, organic solar cells, dye-sensitised solar cells, organic optical detectors, electroluminescent devices, organic integrated circuits, organic light-emitting transistors, organic solar cells, dye-sensitised solar cells, organic optical detectors, organic laser diodes, light-emitting electrochemical cells, organic plasmon emitting devices, organic photovoltaic elements, organic photovoltaic devices, and organic photoreceptors.

12. The device of claim 1, wherein B, identically or differently on each occurrence, is selected from the group consisting of structural units of formulae (7) through (11):

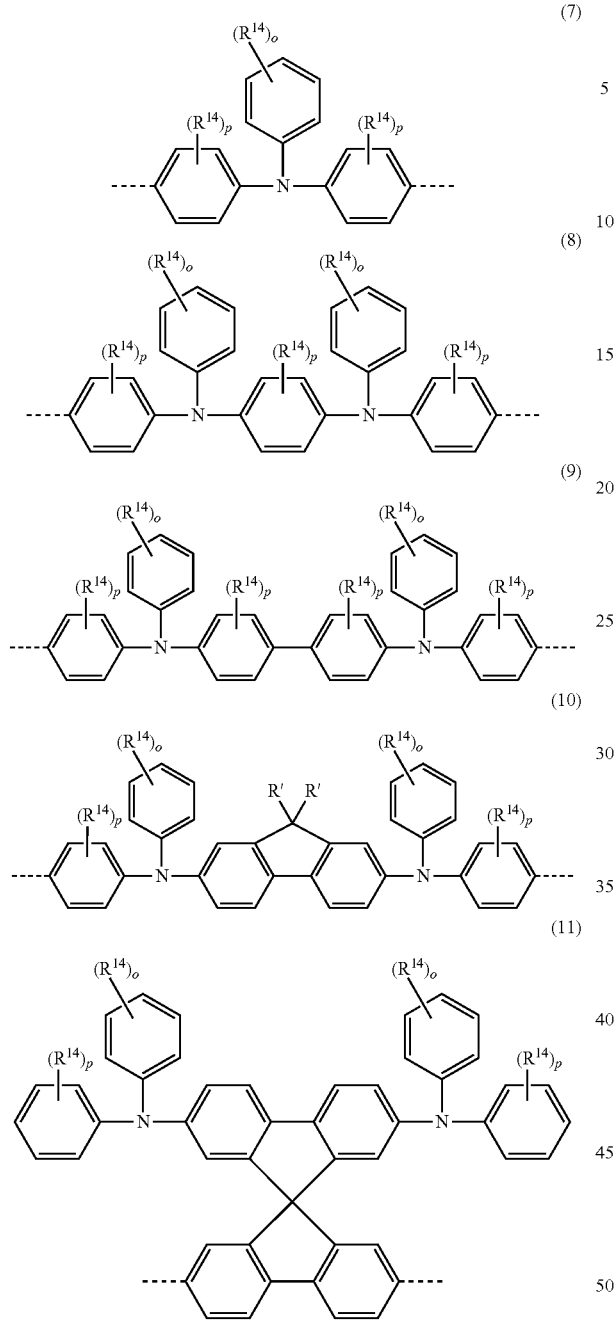

wherein
R$^{14}$ is a straight-chain, branched, or cyclic alkyl radical having 1 or 3 to 12 C atoms respectively or a straight-chain, branched, or cyclic alkenyl radical having 2 or 3 to 12 C atoms respectively;

R' is on each occurrence, independently of one another, H, halogen, —CN, —NC, —NCO, —NCS, —OCN, —SCN, —C(=O)NR$^4$R$^5$, —C(=O)X, —C(=O)R$^4$, —NH$_2$, —NR$^4$R$^5$, —SH, —SR$^4$, —SO$_3$H, —SO$_2$R$^4$, OH, —NO$_2$, —CF$_3$, —SF, optionally substituted silyl, or an optionally substituted hydrocarbon radical having 1 to 40 C atoms, which optionally comprises one or more heteroatoms, and wherein R$^2$ and R$^3$ together optionally define a carbyl radical, or, together with the fluorene radical to which they are bonded, optionally define a Spiro group;

o is in each case, independently of one another, 0, 1, or 2; and p is in each case, independently of one another, 0, 1, 2, 3, or 4.

13. The device of claim 1, wherein A, identically or differently on each occurrence, is selected from the group consisting of structural units of formulae (42) through (53):

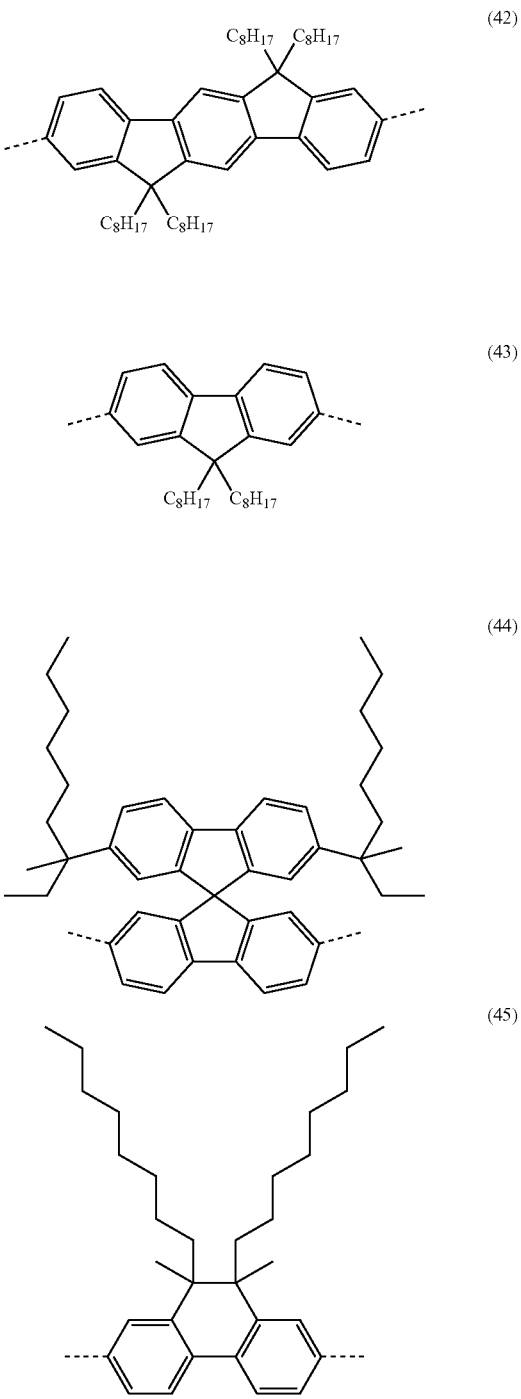

(46)
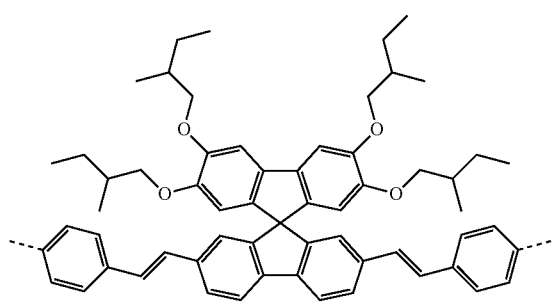
(47)
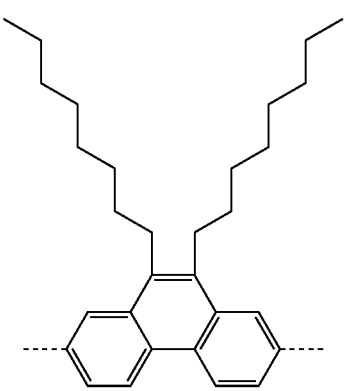
(48)
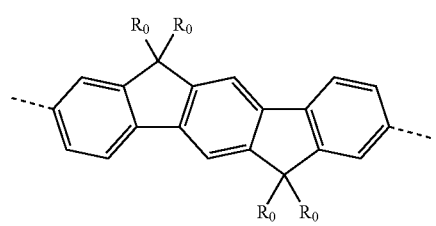
(49)
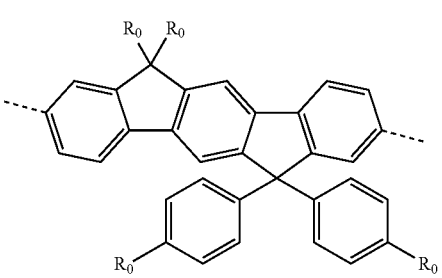
(50)
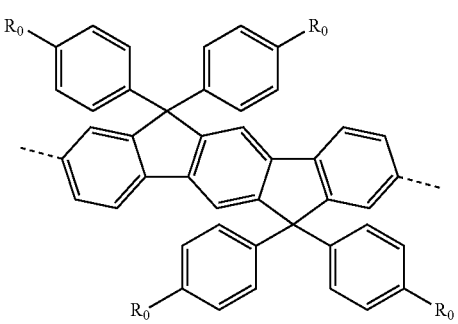
(51)
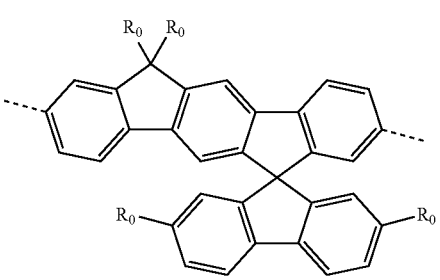
(52)
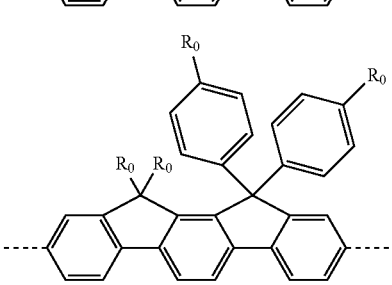
(53)
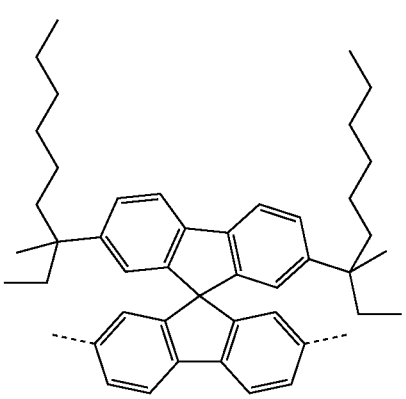
wherein
$R_0$ is H, halogen or optionally a fluorinated, linear, or branched alkyl or alkoxy group having 1 to 12 C atoms.
14. The device of claim 1, wherein A, identically or differently on each occurrence, is selected from the group consisting of structural units of formulae (44), (46), (49), (50), (51), and (53):
(44)
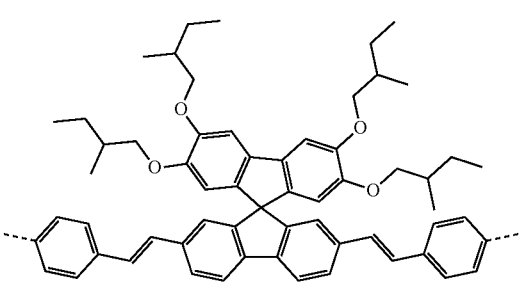
(46)

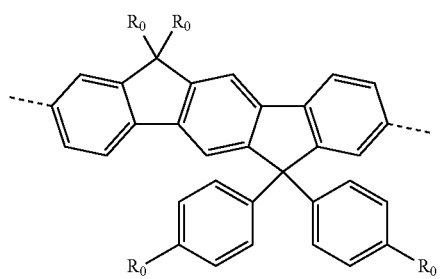
(49)
(50)
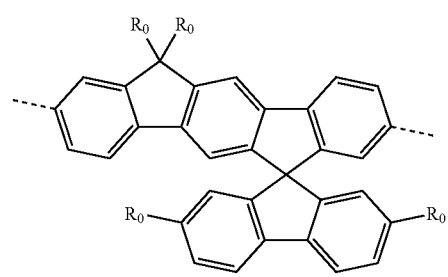
(51)
(53)
wherein
$R_0$ is H, halogen or optionally a fluorinated, linear or branched alkyl or alkoxy group having 1 to 12 C atoms.
* * * * *